United States Patent
Shimura et al.

(10) Patent No.: US 9,311,993 B2
(45) Date of Patent: Apr. 12, 2016

(54) NONVOLATILE SEMICONDUCTOR MEMORY DEVICE

(71) Applicant: KABUSHIKI KAISHA TOSHIBA, Tokyo (JP)

(72) Inventors: Yasuhiro Shimura, Yokohama Kanagawa (JP); Takuya Futatsuyama, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/474,040

(22) Filed: Aug. 29, 2014

(65) Prior Publication Data

US 2015/0279474 A1    Oct. 1, 2015

(30) Foreign Application Priority Data

Mar. 31, 2014   (JP) ................. 2014-072383

(51) Int. Cl.
G11C 16/26    (2006.01)
G11C 11/56    (2006.01)
G11C 16/04    (2006.01)

(52) U.S. Cl.
CPC ........ *G11C 11/5642* (2013.01); *G11C 16/0483* (2013.01)

(58) Field of Classification Search
CPC ........................................................ G11C 16/26
USPC .................................................... 365/185.18
See application file for complete search history.

(56) References Cited

U.S. PATENT DOCUMENTS

| 8,917,548 | B2 * | 12/2014 | Edahiro et al. | 365/185.02 |
| 2013/0016561 | A1 * | 1/2013 | Nam | 365/185.11 |
| 2014/0140148 | A1 * | 5/2014 | An | 365/189.14 |

FOREIGN PATENT DOCUMENTS

JP    2010118580 A    5/2010

* cited by examiner

*Primary Examiner* — Son Mai
(74) *Attorney, Agent, or Firm* — Patterson & Sheridan, LLP

(57) ABSTRACT

A nonvolatile semiconductor memory device comprises a memory cell array including a plurality of memory cells, and a control circuit for the memory cell array. The control circuit is configured to perform a pre-read operation to read pre-selected memory cells before a read operation on target memory cells is performed and to change a read voltage to be applied to the target memory cells during the read operation based on a result of the pre-read operation.

20 Claims, 16 Drawing Sheets

NONVOLATILE SEMICONDUCTOR MEMORY DEVICE

CROSS-REFERENCE TO RELATED APPLICATION

This application is based upon and claims the benefit of priority from Japanese Patent Application No. 2014-072383, filed Mar. 31, 2014, the entire contents of which are incorporated herein by reference.

FIELD

Embodiments described herein relate generally to a nonvolatile semiconductor memory device.

BACKGROUND

In a nonvolatile semiconductor memory device, for example, a NAND type flash memory, a problem in reliability of data retention in a memory cell may become more problematic with miniaturization and an increase in the number of stacked layers in a three-dimensional structure. For example, when the threshold voltage of the memory cell is changed, it may be necessary to perform a reread operation (retry read) and a total time for a read operation may increase because of the time required for performing the reread operation.

DETAILED DESCRIPTION

Embodiments provide a nonvolatile semiconductor memory device capable of reducing the occurrence of erroneous reading.

In general, according to one embodiment, there is provided a nonvolatile semiconductor memory device comprising a memory cell array including a plurality of memory cells, and a control circuit for the memory cell array. The control circuit is configured to perform a pre-read operation to read pre-selected memory cells before a read operation on target memory cells is performed and to change a read voltage to be applied to the target memory cells during the read operation based on the result of a pre-read operation.

A nonvolatile semiconductor memory device according to embodiments is described below with reference to the drawings.

First Embodiment

First, a nonvolatile semiconductor memory device 100 according to a first embodiment will be described with reference to FIG. 1.

Configuration

Figure 1:
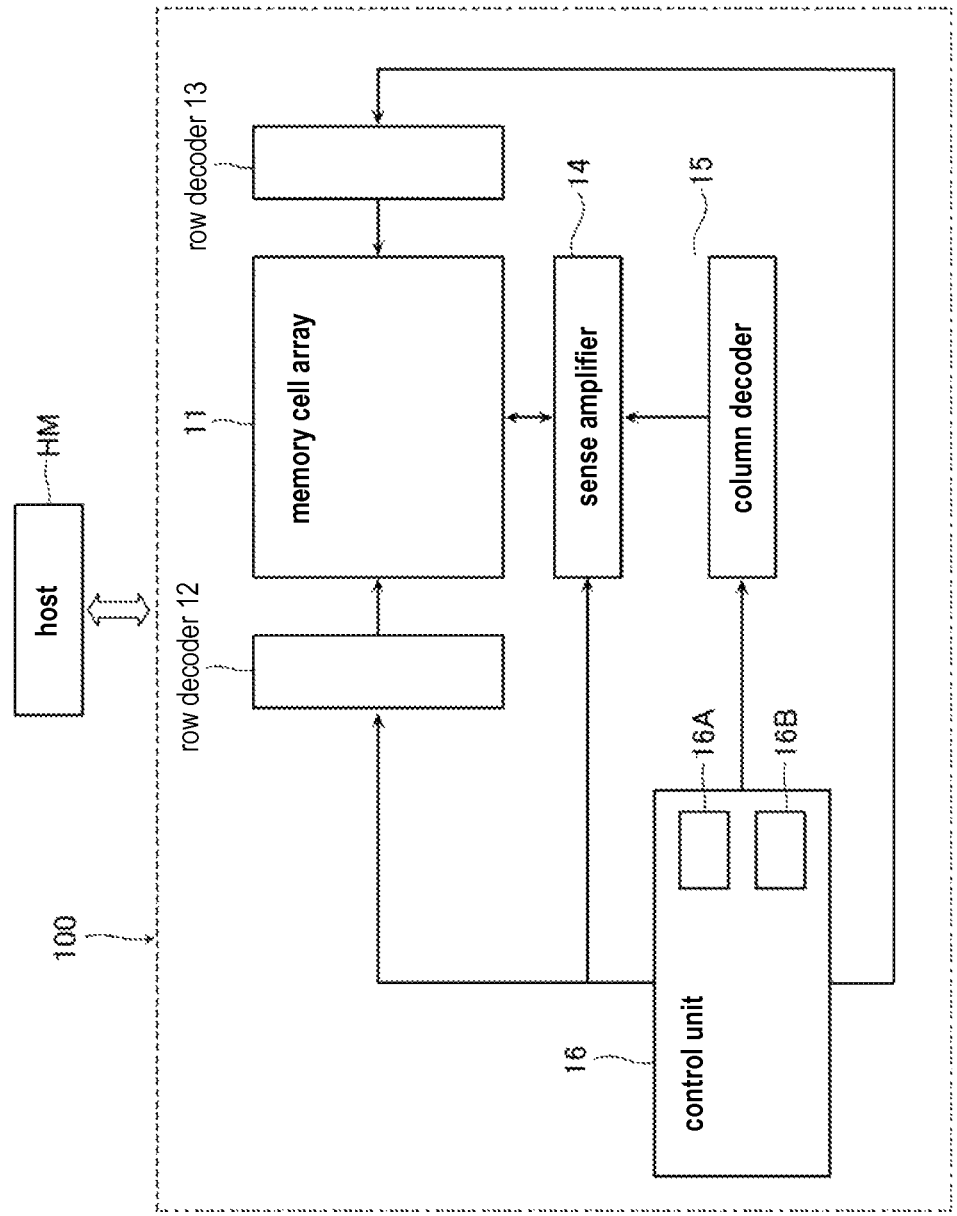
FIG. 1 is one example of a block diagram illustrating a nonvolatile semiconductor memory device according to a first embodiment.

FIG. 1 is a block diagram illustrating the nonvolatile semiconductor memory device 100 according to the first embodiment. As illustrated in FIG. 1, the nonvolatile semiconductor memory device 100 according to the first embodiment includes a memory cell array 11, row decoders 12 and 13, a sense amplifier 14, a column decoder 15, and a control unit 16.

The memory cell array 11 has memory transistors MTr for electrically storing data. The row decoders 12 and 13 decode block address signals and gate address signals and controls the memory cell array 11. A command or the like is transmitted from a memory controller or a host HM to the nonvolatile semiconductor memory device 100. The control unit 16 of the nonvolatile semiconductor memory device 100 controls the memory cell array 11 or the like according to the command.

The sense amplifier 14 reads data from the memory cell array 11. The column decoder 15 decodes column address signals and controls the sense amplifier 14. The control unit 16 boosts a reference voltage to generate a high voltage that is required at the time of write and erase operations. Further, the control unit 16 generates a control signal to control the row decoders 12 and 13, the sense amplifier 14, the column decoder 15, and the like and transmits the signal to peripheral circuits thereof. In addition, the control unit 16 includes a counter 16A which counts the number of cumulative times (NWE) write and erase operations have been performed on the memory cell array 11, and an ECC circuit 16B which performs an error detecting operation and an error correcting operation of read data.

Figure 2:
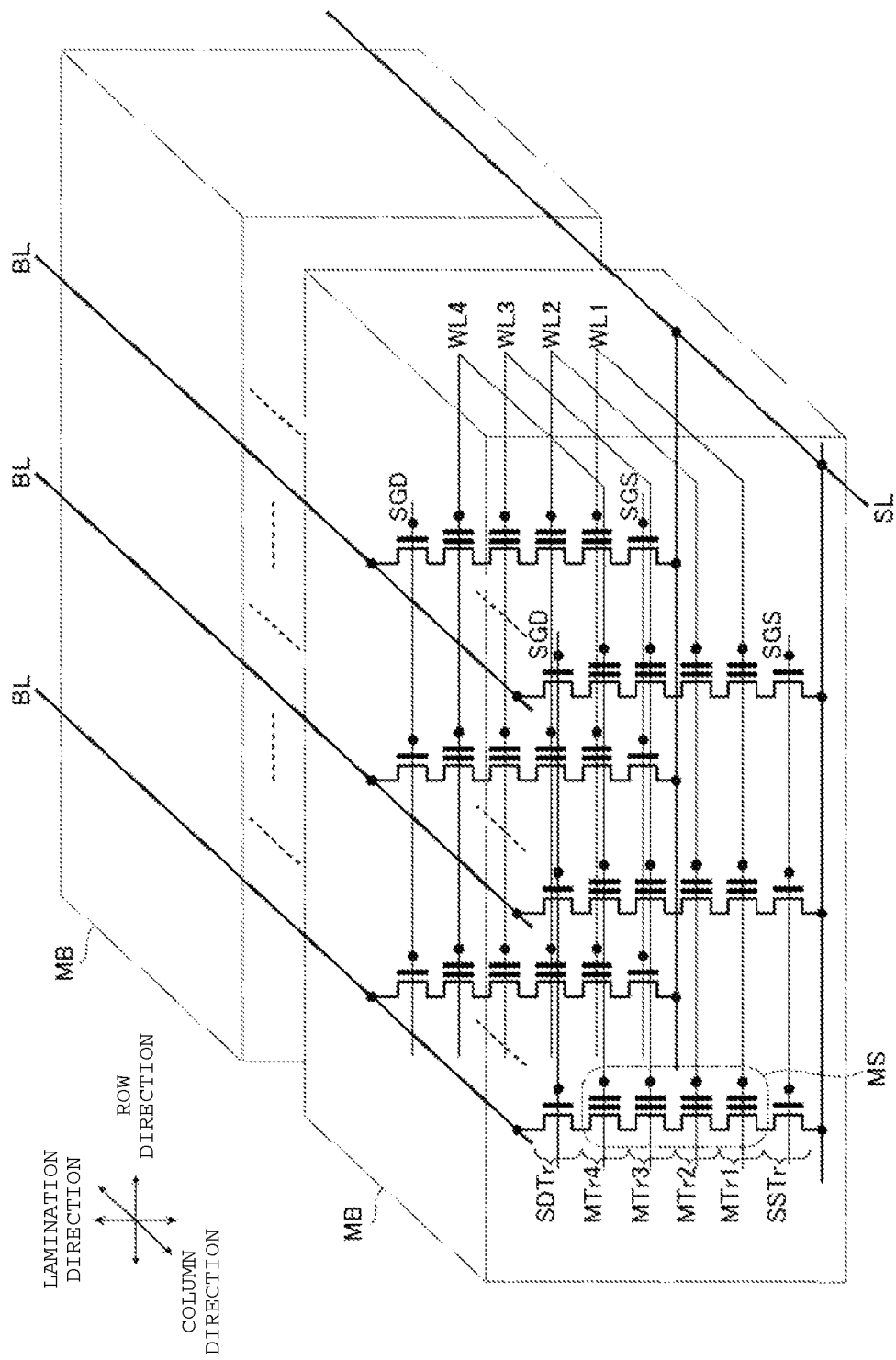
FIG. 2 is one example of an equivalent circuit diagram of a memory cell array.
Figure 3:
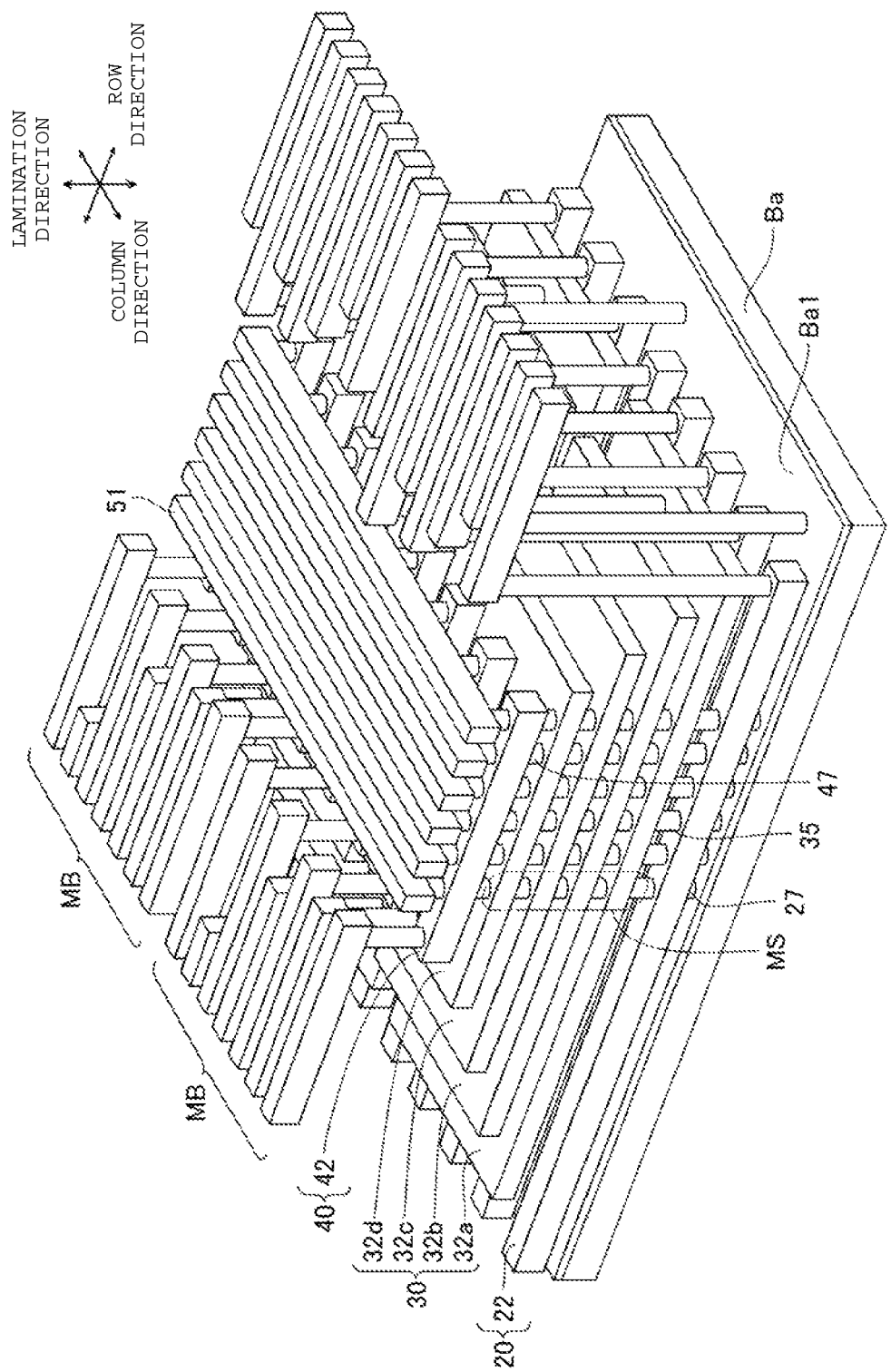
FIG. 3 is one example of a schematic perspective view of the memory cell array.
Figure 4:
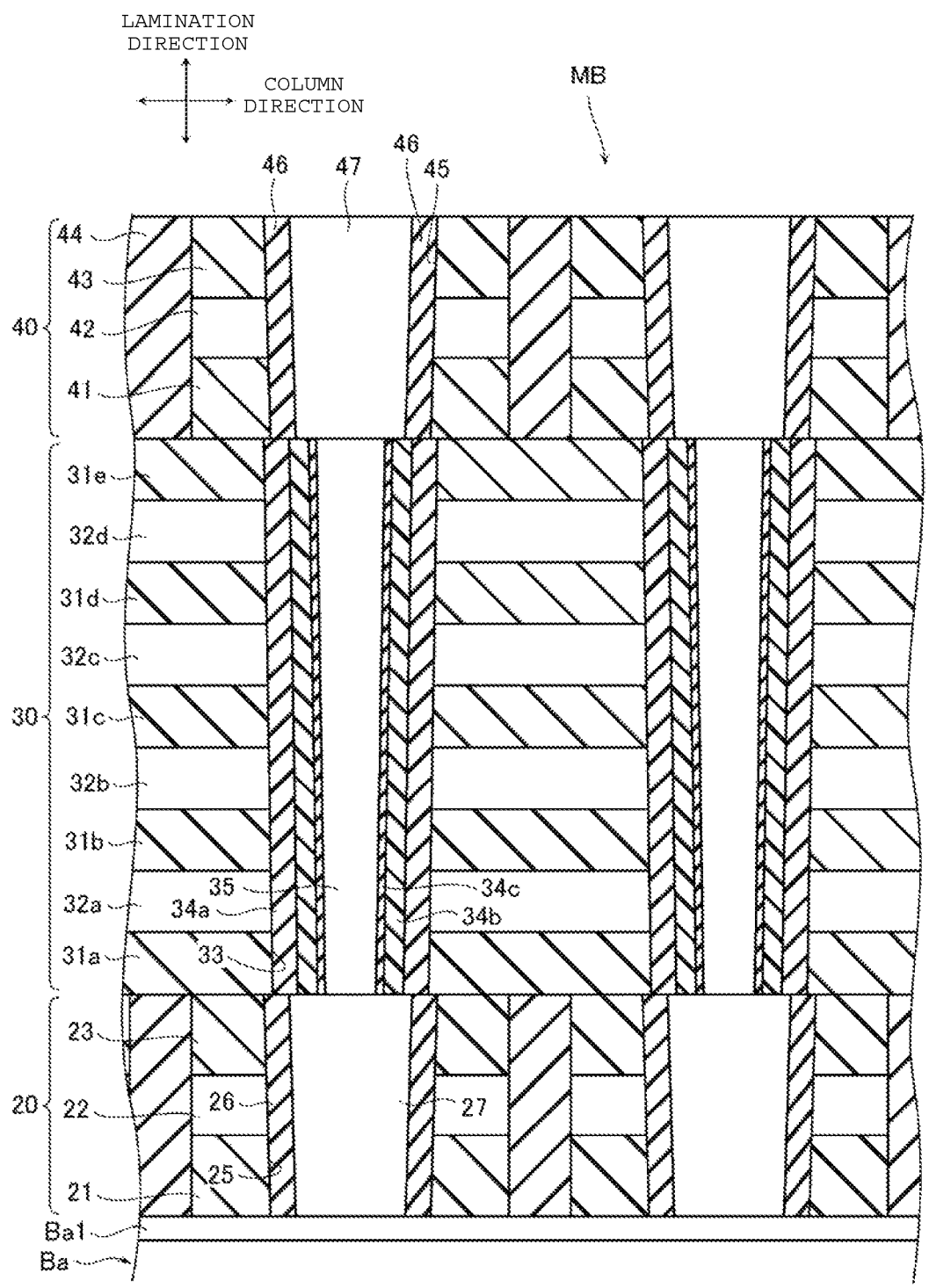
FIG. 4 is one example of a cross-sectional view of FIG. 3.

Referring to FIGS. 2 to 4, a stacked structure and a circuit configuration of the memory cell array 11 will be described below. FIG. 2 is an equivalent circuit diagram of the memory cell array 11. FIG. 3 is a schematic perspective view of the memory cell array 11. FIG. 4 is a cross-sectional view of FIG. 3. Here, the row direction represents a direction orthogonal to the stacking direction and the column direction represents a direction orthogonal to the stacking direction and the row direction. Note that interlayer insulating layers provided between wirings are omitted in FIG. 3.

As illustrated in FIG. 2, the memory cell array 11 has plural memory blocks MB. The memory blocks MB are arranged on a semiconductor substrate Ba (not illustrated) in the column direction. In other words, one memory block MB is formed for each predetermined region on the semiconductor substrate Ba.

As illustrated in FIG. 2, each memory block MB includes plural memory strings MS, source-side selection transistors SSTr, and drain-side selection transistors SDTr. Each memory string MS includes memory transistors MTr1 to MTr4 connected in series and extends in the stacking direction as a longitudinal direction. Each drain-side selection transistor SDTr is connected to one end (a memory transistor MTr4) of each memory string MS.

Each source-side selection transistor SSTr is connected to the other end (a memory transistor MTr1) of each memory string MS. For example, plural rows and columns of memory strings MS are arranged in a matrix shape in each memory block MB. Each memory string MS may include four or more memory transistors.

As illustrated in FIG. 2, in each memory block MB, the control gates of the memory transistors MTr1 arranged in a matrix form are commonly connected to a word line WL1. In the same manner, the control gates of the memory transistors MTr2 are commonly connected to a word line WL2. The control gates of the memory transistors MTr3 are commonly connected to a word line WL3. The control gates of the memory transistors MTr4 are commonly connected to a word line WL4. Each of the word lines WL1 to WL4 is formed as a plate-like electrode extending in the row direction and the column direction. The word lines WL1 to WL4 are controlled by independent signals.

As illustrated in FIG. 2, in each memory block MB, the control gates of the drain-side selection transistors SDTr arranged in the row direction are commonly connected to one drain-side selection gate line SGD. The plural drain-side selection gate line SGD are provided in the column direction and are controlled by independent signals. The other ends of the drain-side selection transistors SDTr arranged in the column direction are commonly connected to a bit line BL. Each bit line BL is formed to extend in the column direction across the memory blocks MB. The plural bit lines BL are provided in the row direction, and are controlled by independent signals.

As illustrated in FIG. 2, in each memory block MB, the control gates of the source-side selection transistors SSTr arranged in the row direction are commonly connected to one source-side selection gate line SGS. The plural source-side selection gate lines SGS are provided in the column direction, and are controlled by independent signals. In addition, the other ends of the source-side selection transistors SSTr arranged in the column direction are commonly connected to a source line SL.

The circuit configuration of the memory blocks MB as described above is achieved by the stacked structure illustrated in FIGS. 3 and 4. Each memory block MB includes a source-side selection transistor layer 20, a memory transistor layer 30, and a drain-side selection transistor layer 40 that are sequentially stacked on the semiconductor substrate Ba.

The source-side selection transistor layer 20 is a layer that includes the source-side selection transistors SSTr. The memory transistor layer 30 is a layer that includes the memory strings MS (memory transistors MTr1 to MTr4). The drain-side selection transistor layer 40 is a layer that includes the drain-side selection transistors SDTr.

As illustrated in FIGS. 3 and 4, the source-side selection transistor layer 20 has source-side first insulating layers 21, source-side conductive layers 22, and source-side second insulating layers 23 that are sequentially formed on the semiconductor substrate Ba. The source-side conductive layer 22 is formed to extend in the row direction.

The source-side first insulating layers 21 and the source-side second insulating layers 23 are made of, for example, silicon oxide ($SiO_2$) or silicon nitride (SiN). The source-side conductive layers 22 are made of, for example, polysilicon (p-Si).

As illustrated in FIG. 4, the source-side selection transistor layer 20 also has source-side holes 25 that are formed to penetrate the source-side first insulating layer 21, the source-side conductive layer 22, and the source-side second insulating layer 23. The source-side holes 25 are formed in a matrix form in the row and column directions.

Furthermore, as illustrated in FIG. 4, the source-side selection transistor layer 20 has source-side gate insulation layers 26 and source-side semiconductor layers 27 that are sequentially formed on the sidewalls of the source-side holes 25. The source-side gate insulation layers 26 are formed with a predetermined thickness on the sidewalls of the source-side holes 25. The source-side semiconductor layers 27 are formed to fill up the source-side holes 25. Each source-side semiconductor layer 27 is formed in a substantially columnar shape extending in the stacking direction. The top surfaces of the source-side semiconductor layers 27 are formed in contact with the bottom surfaces of respective memory semiconductor layers 35 which will be described later. The source-side semiconductor layers 27 are formed on a diffusion layer Ba1 on the semiconductor substrate Ba. The diffusion layer Ba1 functions as a source line SL.

The source-side gate insulation layers 26 are made of, for example, silicon oxide ($SiO_2$). The source-side semiconductor layers 27 are made of, for example, polysilicon (p-Si).

In the configuration of the source-side selection transistor layer 20, the source-side conductive layers 22 function as the control gates of the source-side selection transistors SSTr. The source-side conductive layers 22 also function as the source-side selection gate lines SGS.

As illustrated in FIGS. 3 and 4, the memory transistor layer 30 has first to fifth insulating layers between word lines 31a to 31e and first to fourth word-line conductive layers 32a to 32d that are sequentially stacked on the source-side selection transistor layer 20. The first to fourth word-line conductive layers 32a to 32d are formed to expand in a two-dimensional manner (in a plate-like form) in the row and column directions. The first to fourth word-line conductive layers 32a to 32d are separated for each memory block MB.

The first to fifth insulating layers between word lines 31a to 31e are made of, for example, silicon oxide ($SiO_2$). The first to fourth word-line conductive layers 32a to 32d are made of, for example, polysilicon (p-Si).

In addition, as illustrated in FIG. 4, the memory transistor layer 30 also has memory holes 33 that are formed to penetrate the first to fifth insulating layers between word lines 31a to 31e and the first to fourth word-line conductive layers 32a to 32d. The memory holes 33 are formed in a matrix form in the row and column directions. The memory holes 33 are formed at positions overlapping with the source-side holes 25 as seen from the stacking direction.

Further, as illustrated in FIG. 4, the memory transistor layer 30 has block insulating layers 34a, charge storage layers 34b, tunnel insulating layers 34c, and memory semiconductor layers 35 that are sequentially formed on the sidewalls of the memory holes 33. The block insulating layers 34a are formed with a predetermined thickness on the sidewalls of the memory holes 33. The charge storage layers 34b are formed with a predetermined thickness on the sidewalls of the block insulating layers 34a. The tunnel insulating layers 34c are formed with a predetermined thickness on the sidewalls of the charge storage layers 34b. The memory semiconductor layers 35 are formed to fill up the memory holes 33. Each memory semiconductor layer 35 is formed in a substantially columnar shape extending in the stacking direction as the longitudinal direction. The bottom surfaces of the memory semiconductor layers 35 are formed in contact with the top surfaces of the respective source-side semiconductor layers 27. In addition, the top surfaces of the memory semiconductor layers 35 are formed in contact with the bottom surfaces of respective columnar drain-side semiconductor layers 47 described below.

The block insulating layers 34a and the tunnel insulating layers 34c are made of, for example, silicon oxide ($SiO_2$). The charge storage layers 34b are made of, for example, silicon nitride (SiN). The memory semiconductor layers 35 are made of, for example, polysilicon (p-Si).

In the configuration of the memory transistor layer 30, the first to fourth word-line conductive layers 32a to 32d function as the control gates of the memory transistors MTr1 to MTr4. The first to fourth word-line conductive layers 32a to 32d also function as portions of the word lines WL1 to WL4.

As illustrated in FIGS. 3 and 4, the drain-side selection transistor layer 40 has drain-side first insulating layers 41, drain-side conductive layers 42, and drain-side second insulating layers 43 that are sequentially stacked on the memory transistor layer 30. The drain-side conductive layers 42 are formed at positions overlapping with the memory semiconductor layers 35 as seen from the stacking direction. The drain-side conductive layers 42 are formed to extend in the row direction.

The drain-side first insulating layers 41 and the drain-side second insulating layers 43 are made of, for example, silicon oxide ($SiO_2$) or silicon nitride (SiN). The drain-side conductive layers 42 are made of, for example, polysilicon (p-Si).

As illustrated in FIG. 4, the drain-side selection transistor layer 40 also has drain-side holes 45 that are formed to penetrate the drain-side first insulating layers 41, the drain-side conductive layers 42, and the drain-side second insulating layers 43. The drain-side holes 45 are formed in a matrix form in the row and column directions. The drain-side holes 45 are formed at positions matching the memory holes 33.

Furthermore, as illustrated in FIG. 4, the drain-side selection transistor layer 40 has drain-side gate insulation layers 46, and the drain-side semiconductor layers 47 that are formed on the sidewalls of the drain-side holes 45. The drain-side gate insulation layers 46 are formed with a predetermined thickness on the sidewalls of the drain-side holes 45. The drain-side semiconductor layers 47 are formed to fill up the drain-side holes 45. Each drain-side semiconductor layer 47 is formed in a substantially columnar shape extending in the stacking direction. The bottom surfaces of the drain-side semiconductor layers 47 are formed in contact with the top surfaces of the memory semiconductor layers 35. Bit line layers 51 are formed on the top surfaces of the drain-side semiconductor layers 47. The bit line layers are formed to extend in the column direction at a predetermined pitch in the row direction. The bit line layers 51 function as bit lines BL.

The drain-side gate insulation layers 46 are made of, for example, silicon oxide ($SiO_2$). The drain-side semiconductor layers 47 are made of, for example, polysilicon (p-Si).

In the configuration of the drain-side selection transistor layer 40, the drain-side conductive layers 42 function as the control gates of the drain-side selection transistors SDTr. The drain-side conductive layers 42 also function as portions of drain-side selection gate lines SGD.

Figure 5:
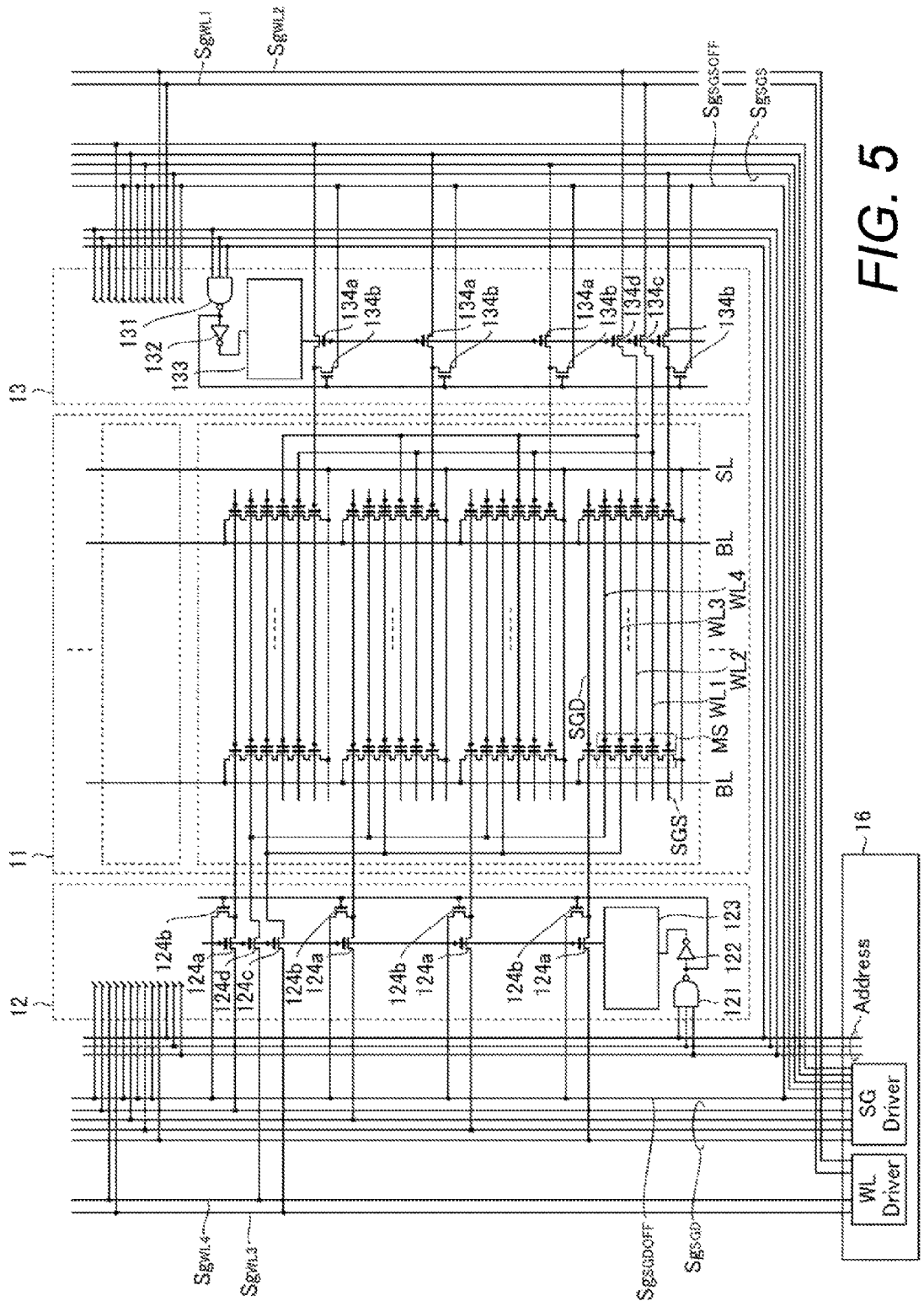
FIG. 5 is one example of a circuit diagram of the nonvolatile semiconductor memory device according to the first embodiment.

Next, referring to FIG. 5, a circuit configuration of the row decoders 12 and 13 will be described. FIG. 5 is a circuit diagram of the nonvolatile semiconductor memory device 100.

As illustrated in FIG. 5, the row decoder 12 includes a NAND circuit 121, a NOT circuit 122, and a voltage conversion circuit 123 for each memory block MB.

Each NAND circuit 121 receives an address signal Address from the control unit 16 and outputs the signal to the NOT circuit 122. The NOT circuit 122 receives the signal from the NAND circuit 121 and outputs the signal to the voltage conversion circuit 123. The voltage conversion circuit 123 outputs the voltage according to the signal received from the NOT circuit 122.

As illustrated in FIG. 5, the row decoder 12 also includes a pair of first and second transfer transistors 124a and 124b for each memory string MS connected to the same drain-side selection gate line SGD.

One end of the first transfer transistor 124a receives a voltage $Sg_{SGD}$ from the control unit 16. The voltage $Sg_{SGD}$ is a voltage for driving a particular drain-side selection gate line SGD. The other end of each first transfer transistor 124a is connected to a drain-side selection gate line SGD. The control gate of each first transfer transistor 124a receives voltage from the voltage conversion circuit 123.

One end of each second transfer transistor 124b receives a voltage $Sg_{SGDOFF}$ from the control unit 16. The voltage $Sg_{SGDOFF}$ is a voltage for disabling a drain-side selection gate line SGD. The other end of each second transfer transistor 124b is connected to a drain-side selection gate line SGD. The control gate of each second transfer transistor 124b receives voltage from the NAND circuit 121.

In addition, as illustrated in FIG. 5, the row decoder 12 has third and fourth transfer transistors 124c and 124d for each memory block MB.

One ends of the third and fourth transfer transistors 124c and 124d receive voltages $Sg_{WL3}$ and $Sg_{WL4}$, respectively, from the control unit 16. The voltages $Sg_{WL3}$ and $Sg_{WL4}$ are voltages for driving the word lines WL3 and WL4. The other ends of the third and fourth transfer transistors 124c and 124d are connected to the word lines WL3 and WL4. The control gates of the third and fourth transfer transistors 124c and 124d receive voltages from the voltage conversion circuit 123.

As illustrated in FIG. 5, the row decoder 13 has a NAND circuit 131, a NOT circuit 132, and a voltage conversion circuit 133 for each memory block MB.

Each NAND circuit 131 receives an address signal Address from the control unit 16 and outputs the signal to the NOT circuit 132. The NOT circuit 132 receives the signal from the NAND circuit 131 and outputs the signal to the voltage conversion circuit 133. The voltage conversion circuit 133 outputs the voltage according to the signal received from the NOT circuit 132.

As illustrated in FIG. 5, the row decoder 13 also has a pair of first and second transfer transistors 134a and 134b for each memory strings MS connected to the same source-side selection gate line SGS.

One end of the first transfer transistor 134a receives a voltage $Sg_{SGS}$ from the control unit 16. The voltage $Sg_{SGS}$ is a signal for driving a particular source-side selection gate line SGS. The other end of each first transfer transistor 134a is connected to a source-side selection gate line SGS. The control gate of each first transfer transistor 134a receives voltage from the voltage conversion circuit 133.

One end of each second transfer transistor 134b receives a voltage $Sg_{SGSOFF}$ from the control unit 16. The voltage $Sg_{SGSOFF}$ is a voltage for disabling a source-side selection gate line SGS. The other end of each second transfer transistor 134b is connected to a source-side selection gate line SGS. The control gate of each second transfer transistor 134b receives voltage from the NAND circuit 131.

As illustrated in FIG. 5, the row decoder 13 also has third and fourth transfer transistors 134c and 134D for each memory block MB.

One ends of the third and fourth transfer transistors 134c and 134d receive voltages $Sg_{WL1}$ and $Sg_{WL2}$, respectively, from the control unit 16. The voltages $Sg_{WL1}$ and $Sg_{WL2}$ are voltages for driving the word lines WL1 and WL2. The other ends of the third and fourth transfer transistors 134c and 134d are connected to the word lines WL1 and WL2. The control gates of the third and fourth transfer transistors 134c and 134d receive voltage from the voltage conversion circuit 133.

Figure 6:
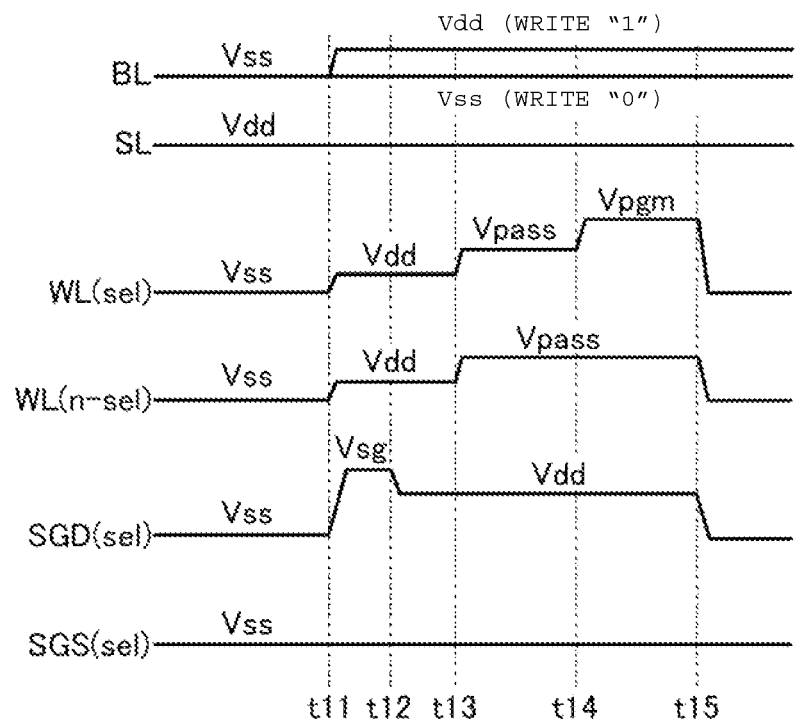
FIG. 6 is one example of a waveform diagram illustrating a write operation of the nonvolatile semiconductor memory device according to the first embodiment.
Figure 7:
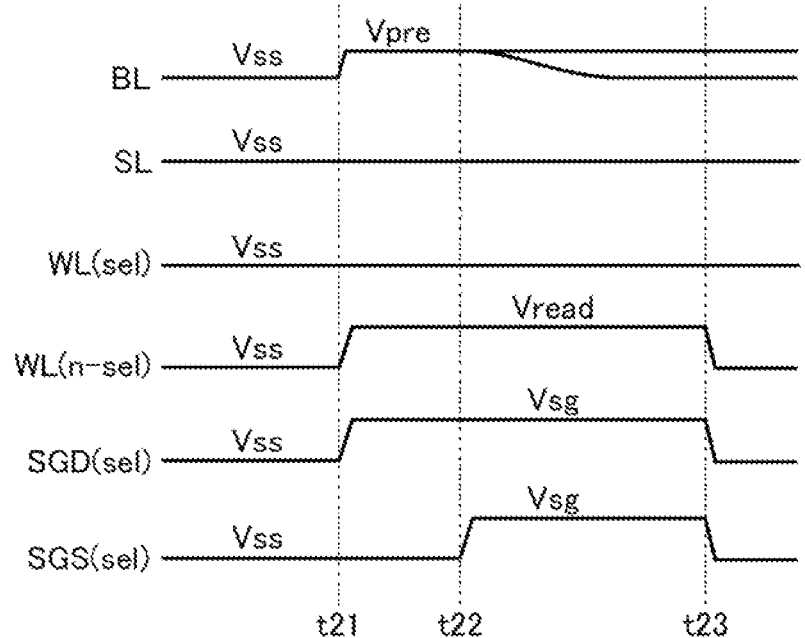
FIG. 7 is one example of a waveform diagram illustrating a read operation of the nonvolatile semiconductor memory device according to the first embodiment.
Figure 8:
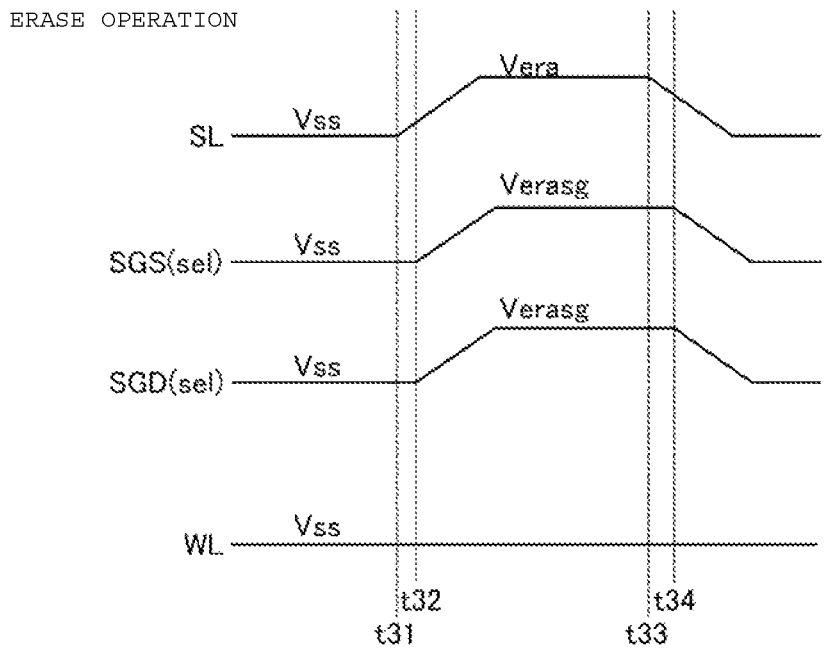
FIG. 8 is one example of a waveform diagram illustrating an erase operation of the nonvolatile semiconductor memory device according to the first embodiment.

Operation of Nonvolatile Semiconductor Memory Device 100 According to First Embodiment The operation of the nonvolatile semiconductor memory device 100 according to the first embodiment will described below. First, referring to waveform diagrams of FIGS. 6 to 8, write, read, and erase operations of the nonvolatile semiconductor memory device 100 according to the first embodiment will be described. The operations illustrated in FIGS. 6 to 8 are performed by the control unit 16. FIG. 6 is an example of a timing chart illustrating a write operation of the nonvolatile semiconductor memory device 100 according to the first embodiment, FIG. 7 is a timing chart illustrating a read operation thereof, and FIG. 8 is an example of a timing chart illustrating an erase operation thereof.

Hereinafter, one of the word lines WL1 to WL4 that is selected for write, read, or erase operations is denoted by a "selected word line WL (sel)". On the other hand, one of the word lines WL1 to WL4 that is not selected for such operations is denoted by an "unselected word line WL (n-sel)". One of the drain-side selection gate lines SGD that is selected for write, read, or erase operations is denoted by a "selected drain-side selection gate line SGD (sel)". On the other hand, other drain-side selection gate lines SGD that are not selected for such operations are each denoted by an "unselected drain-side selection gate line SGD (n-sel)". One of the source-side selection gate lines SGS that is selected for write, read, or erase operations is denoted by a "selected source-side selection gate line SGS (sel)". On the other hand, other source-side selection gate lines SGS that are not selected for such operations are each denoted by an "unselected source-side selection gate line SGS (n-sel)".

Furthermore, one of the memory blocks MB that is selected for write, read, or erase operations is denoted by a "selected memory block MB (sel)". On the other hand, other memory blocks MB that are not selected for such operations are each denoted by an "unselected memory block MB (n-sel)". One of the memory strings MS that is selected for write, read, or erase operations is denoted by a "selected memory string MS (sel)". On the other hand, other memory strings MS that are not selected for such operations are each denoted by an "unselected memory string MS (n-sel)". One of the drain-side selection transistors SDTr that is selected for write, read, or erase operations is denoted by a "selected drain-side selection transistor SDTr (sel)". On the other hand, other drain-side selection transistors SDTr that are not selected for such operations are each denoted by an "unselected drain-side selection transistor SDTr (n-sel)". One of the source-side selection transistors SSTr that is selected for write, read, or erase operations is denoted by a "selected source-side selection transistor SSTr (sel)". In contrast, other source-side selection transistors SSTr that are not selected for such operations are each denoted by an "unselected source-side selection transistor SSTr (n-sel)".

In the write operation, as illustrated in FIG. 6, initially, the source line SL is set at a voltage Vdd, and the others are set at a ground voltage Vss. Then, in writing "1" at time t11, the bit line BL is boosted to the voltage Vdd. Alternatively, in writing "0" at time t11, the bit line BL is maintained at the ground voltage Vss. In addition, at time t11, a selected word line WL (sel) and unselected word lines WL (n-sel) are boosted to the voltage Vdd. Furthermore, at time t11, a selected drain-side selection gate line SGD (sel) is boosted to a voltage Vsg. For example, the voltage Vdd is about 3 V to 4 V, and the voltage Vsg is about 4 V.

Unselected drain-side selection gate lines SGD (n-sel) and unselected source-side selection gate lines SGS (n-sel) are set at the ground voltage Vss. In addition, the word lines WL in unselected blocks MB (n-sel) are set to be in a floating state.

Subsequently, at time t12, the selected drain-side selection gate line SGD (sel) is dropped to the voltage Vdd. Then, at time t13, the selected word line WL (sel) and the unselected word lines WL (n-sel) are boosted to a voltage Vpass. Subsequently, at time t14, the selected word line WL (sel) is boosted to a voltage Vpgm. For example, the voltage Vpass is about 10 V, and the voltage Vpgm is about 18 V.

Then, at time t15, the selected word line WL (sel), the unselected word lines WL (n-sel), and the selected drain-side selection gate line SGD (sel) are dropped to the ground voltage Vss.

By the operation, electric charges are accumulated in the charge storage layers 34b of the memory transistor MTr that is connected to the selected word line WL (sel) in a selected memory string MS (sel), and thus, data is written to the memory transistor MTr.

Next, the read operation will be described with reference to FIG. 7. Initially, the bit line BL, the source line SL, the selected word line WL (sel), the unselected word lines (n-sel), the selected drain-side selection gate line SGD (sel), and the selected source-side selection gate line SGS (sel) are set at the ground voltage Vss. The unselected drain-side selection gate lines SGD (n-sel) and the unselected source-side selection gate lines SGS (n-sel) are set at the ground voltage Vss. Each word line WL in an unselected memory block MB (n-sel) is set to be in a floating state.

Then, at time t21, the bit line BL is boosted to a voltage Vpre. For example, the voltage Vpre is about 1 V. In addition, at time t21, the unselected word lines WL (n-sel) are boosted to a voltage Vread. For example, the voltage Vread is about 4 V. In addition, at time t21, the selected drain-side selection gate line SGD (sel) is boosted to the voltage Vsg. Then, at time t22, the selected source-side selection gate line SGS (sel) is boosted to the voltage Vsg. At this time, by the data retained in a selected memory cell, the bit line BL is maintained at the voltage Vpre, or is discharged to the ground voltage Vss.

Subsequently, at time t23, the unselected word lines WL (n-sel), the selected drain-side selection gate line SGD (sel), and the selected source-side selection gate line SGS (sel) are dropped to the ground voltage Vss.

By the operation, a current that flows from the bit line BL through the selected memory string MS (sel) into the source line SL (from one end to the other end of the memory string MS) is detected and then, data is read through the comparison of the magnitude of the detected current.

Next, the erase operation will be described with reference to FIG. 8. Initially, the source line SL, all the word lines WL, the selected drain-side selection gate line SGD (sel), and the selected source-side selection gate line SGS (sel) are set at the ground voltage Vss. The bit line BL is set to be in a floating state. In addition, the unselected drain-side selection gate lines SGD (n-sel) and the unselected source-side selection gate lines SGS (n-sel) are set to be in a floating state. Furthermore, each word line WL in the unselected block MB (n-sel) is set to be in a floating state.

Then, at time t31, the source line SL is boosted to a voltage Vera. Subsequently, at time t32, the selected drain-side selection gate line SGD (sel) and the selected source-side selection gate line SGS (sel) are boosted to a voltage Verasg. For example, the voltage Vera is about 20 V, and the voltage Verasg is about 15 V.

Next, at time t33, the source line SL is dropped to the ground voltage Vss. Subsequently, at time t34, the selected drain-side selection gate line SGD (sel) and the selected source-side selection gate line SGS (sel) are dropped to the ground voltage Vss.

Through this operation, a gate induced drain leak (GIDL) current is produced near the gates of the source-side selection transistors SSTr, and the generated holes flow into the memory semiconductor layers 35. As a result, the potential of the memory semiconductor layers 35 is boosted. On the other hand, electrons flow toward the semiconductor substrate Ba. Accordingly, due to the potential difference between the memory semiconductor layer 35 and the first to fourth word-line conductive layers 32a to 32d (for example, set at 0 V), the electrons are extracted from the charge storage layer 34b included in the memory transistors MTr1 to MTr4. That is, the erase operation is performed.

However, the NAND type flash memory having a three-dimensional structure as illustrated in FIGS. 1 to 5 includes the semiconductor layer 35 (see FIG. 4) that extends in the stacking direction as a longitudinal direction and functions as bodies of the memory cells as described above. The diameter of the semiconductor layer 35 (the diameter of the memory hole) increases upward in many cases due to restrictions on the manufacturing process of the semiconductor layer 35. The semiconductor layer 35 usually has a so-called reverse tapered shape. Depending on the manufacturing process, the semiconductor layer may have a forward tapered shape, instead of a reverse tapered shape. In both cases, it is not easy to make the diameter of the semiconductor layer 35 substantially uniform in the stacking direction. An example in which the semiconductor layer has a reverse tapered shape will be described below. However, the same problem will arise even if the diameter of the semiconductor layers is different in the stacking direction, in addition to a case where the semiconductor layer has a forward tapered shape.

When the semiconductor layer 35 has a significant reverse tapered shape, a problem of writing characteristics and erasing characteristics changing in the memory cells in the vertical direction may arise.

Figure 9A:
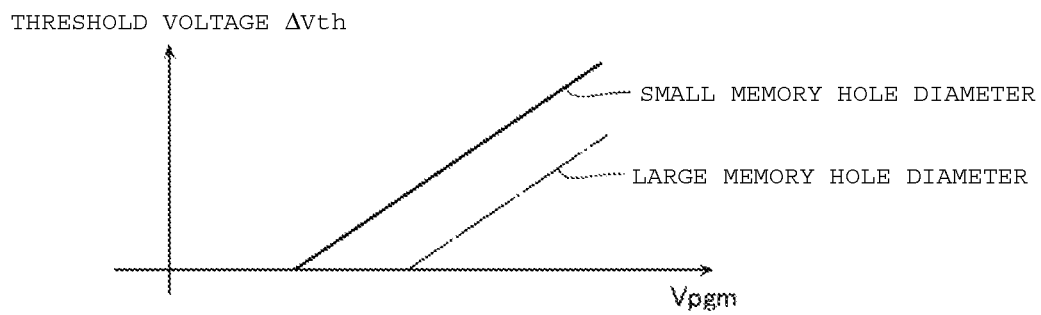
FIG. 9A is one example of a graph illustrating a relationship between a write voltage and an amount of a threshold voltage changed at the time of a write operation.
Figure 9B:
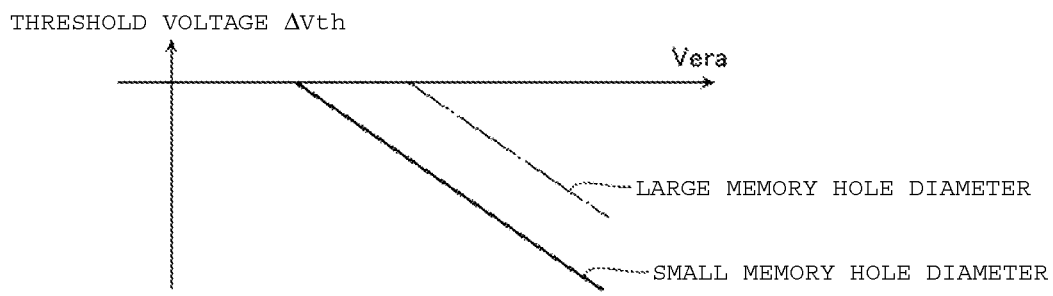
FIG. 9B is one example of a graph illustrating a relationship between an erase voltage and an amount of a threshold voltage changed at the time of an erase operation.

For example, regarding writing characteristics, as illustrated in FIG. 9A, a desired change of a threshold voltage $\Delta Vth$ may be obtained with a relatively low write voltage Vpgm in the memory cells in which the diameter of the memory hole is small. However, when a higher write voltage Vpgm is not applied, a desired change of a threshold voltage $\Delta Vth$ is not obtained in the memory cells in which the diameter of the memory hole is large. In addition, regarding erasing characteristics, as illustrated in FIG. 9B, a desired change of a threshold voltage $\Delta Vth$ may be obtained with a relatively low erase voltage Vera in the memory cells in which the diameter of the memory hole is small. However, when a higher erase voltage Vera is not applied, a desired change of a threshold voltage $\Delta Vth$ is not obtained in the memory cells in which the diameter of the memory hole is large.

Figure 10A:
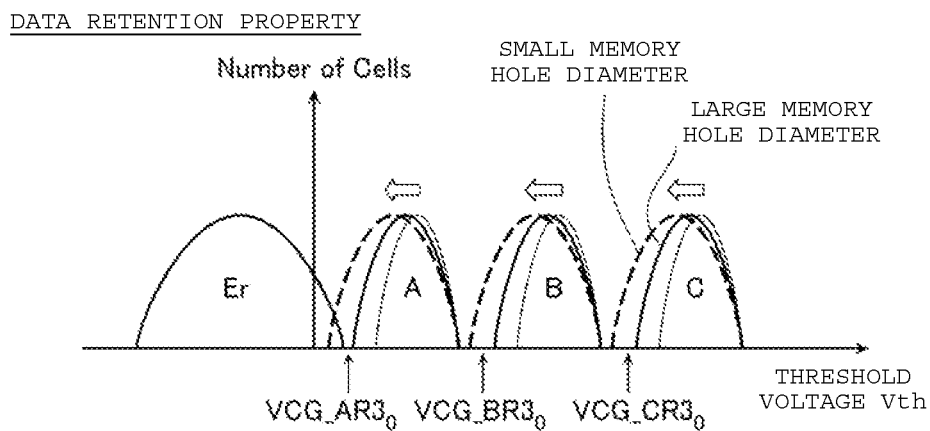
FIG. 10A is one example of a graph illustrating a relationship between a data retention property and a memory hole diameter.

Further, when the semiconductor layer 35 has a significant reverse tapered shape, a problem of a data retention property and a disturbance property varying in the memory cells in the vertical direction may arise. The disturbance property is a property that the threshold voltage distribution of other memory cells is changed by write, erase, and read operations in a certain memory cell. When the semiconductor layer 35 has a significant reverse tapered shape, the data retention property is more deteriorated in the memory cells in which the diameter of the memory hole is small than in the memory cells in which the diameter of the memory hole is large. This is illustrated in FIG. 10A. Specifically, electric charges held in the charge storage layer 34b more easily escape and a lower portion of the threshold voltage distribution is more easily changed to the negative side in the memory cells in which the diameter of the memory hole is small than in the memory cells in which the diameter of the memory hole is large.

Figure 10B:
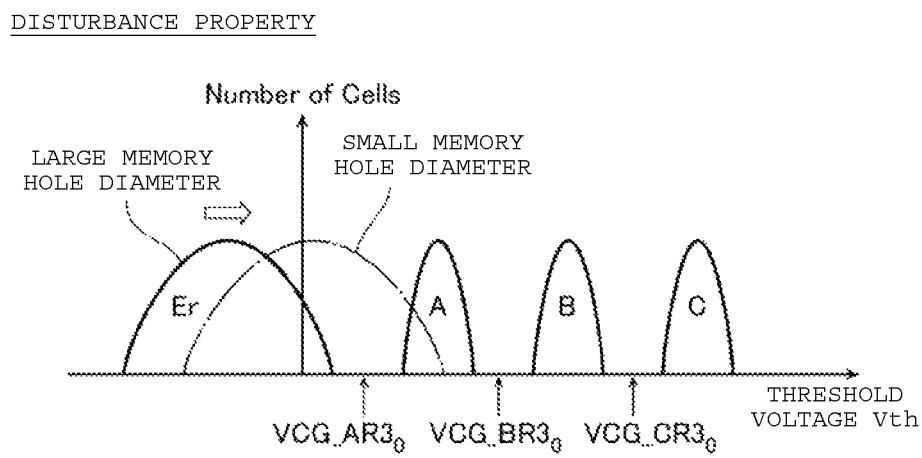
FIG. 10B is one example of a graph illustrating a relationship between a disturbance property and a memory hole diameter.

In addition, when the semiconductor layer 35 has a significant reverse tapered shape, the disturbance property is more deteriorated in the memory cells in which the diameter of the memory hole is small than in the memory cells in which the diameter of the memory hole is large. This is illustrated in FIG. 10B, which shows a change of a threshold voltage distribution Er after the read operation is repeated. Specifically, the threshold voltage distribution Er in an erase state is more easily moved to the positive side in the memory cells in which the diameter of the memory hole is small than in the memory cells in which the diameter of the memory hole is large.

Upon occurrence of such change in the threshold voltage distribution, when the values of the read voltages VCG_AR3, VCG_BR3, and VCG_CR3 applied to a selected word line (a word line connected to a selected memory cell which is selected as a target to be read) at the time of the read operation are maintained at the initial values $VCG\_AR3_0$, $VCG\_BR3_0$, and $VCG\_CR3_0$, there is a high possibility of occurrence of erroneous reading. The erroneous reading may be corrected by correction technique (ECC) only when an error rate is equal to or less than a predetermined value. However, when the error rate exceeds a predetermined value, the correction by ECC is not possible. In this case, it is necessary to change the values of the read voltage VCG_AR3, VCG_BR3, and VCG_CR3 and to perform a reread operation (retry read). As the number of retry read operations increases, an average time required for the read operation increases.

Here, in the embodiment, before a read operation (actual read operation) from the memory cells connected to one word line WL is started, a pre-read operation in which only some memory cells among the memory cells connected to the word line are set as a target to be read is performed. Then, in the actual read operation, which is performed after the pre-read operation, the value of the read voltage used in the read operation from the memory cells arranged along the selected word line is changed based on the read result of the pre-read operation. Specific details of the operation will be described with reference to FIGS. 11 and 12.

In the pre-read operation (Step S1 in FIG. 12), initially, the read voltages VCG_AR3, VCG_BR3, and VCG_CR3 are set to the initial values VCG_AR3$_0$, VCG_BR3$_0$, and VCG_CR3$_0$, and then, some of memory cells (for example, a partial page Ppre for pre-reading) that are set as a target to be read and connected to the selected word line WL are read. In the memory cells of the specific page Ppre for pre-reading, actual data and parity data for error detection are stored in advance.

Figure 11A:
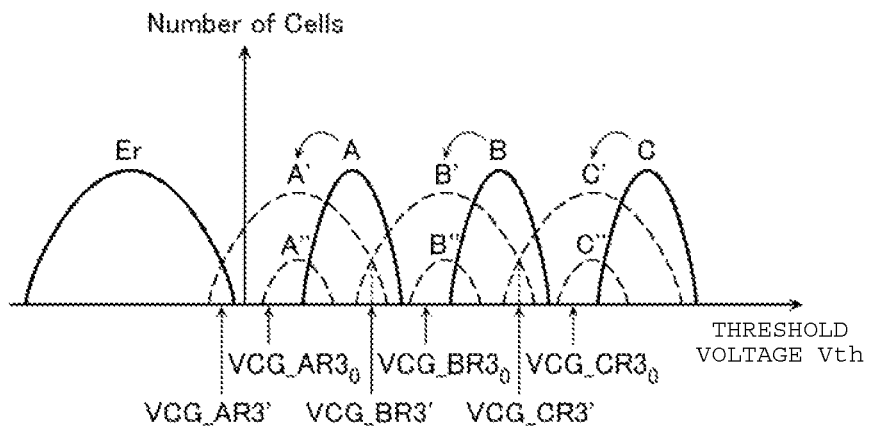
FIG. 11A is one example of a concept diagram illustrating procedures of a read operation according to the first embodiment.
Figure 12:
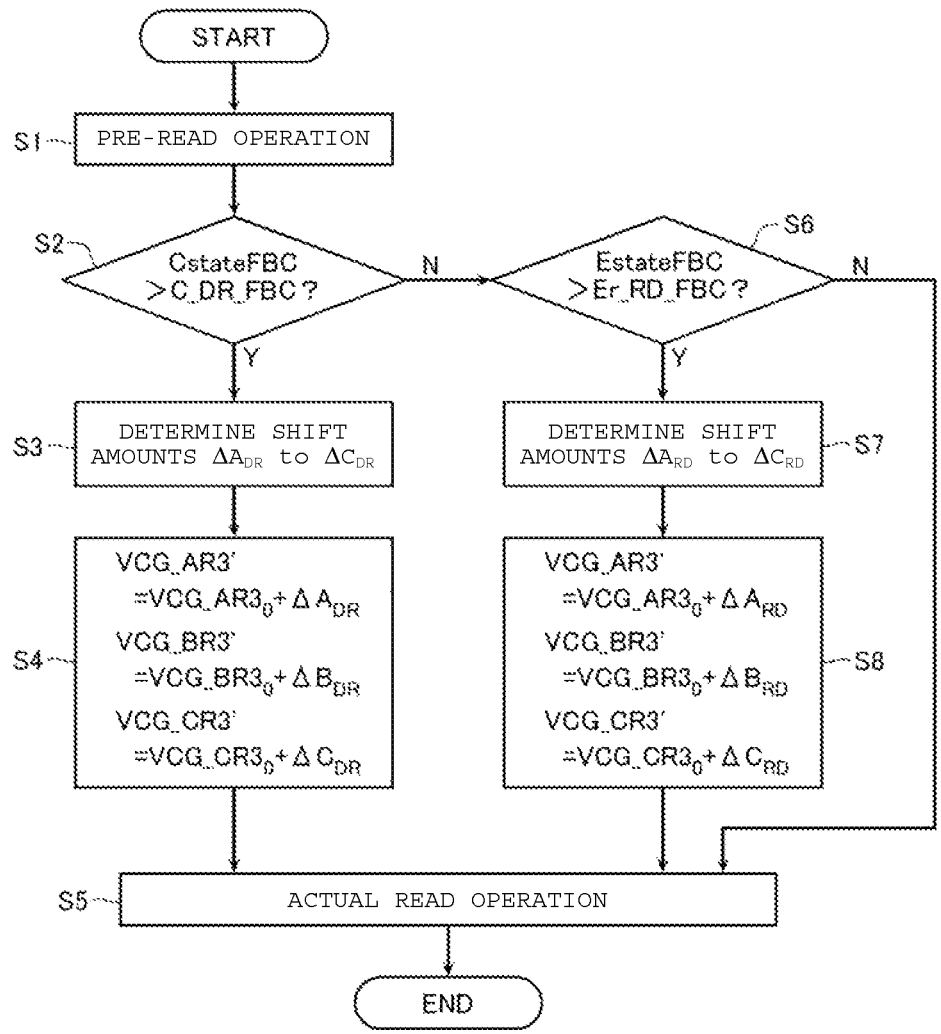
FIG. 12 is one example of a flow chart illustrating the procedures of the read operation according to the first embodiment.

Here, in the threshold voltage distribution of the memory cells immediately after the write operation, the width of each threshold voltage distribution is narrowed as in the distributions A, B, and C as illustrated in FIG. 11A. Then, due to electric charge leakage from the charge storage layer 34b, the threshold voltage distributions of the memory cells are moved from the threshold voltage distributions A, B, and C to threshold voltage distributions A', B', and C' such that the distribution widths are widened to a low voltage side.

As illustrated in FIG. 11A, in the threshold voltage distribution of the page for pre-reading, the width of distributions A", B", and C" (pre-read threshold voltage distributions) are narrower than the widths of the threshold voltage distributions A', B', and C' of the memory cells as the target to be read (read threshold voltage distributions). Here, the center values of the pre-read threshold voltage distributions A", B", and C" are located at the substantially same position as the center values of the read threshold voltage distributions A', B', and C'. That is, the pre-read threshold voltage distributions A", B", and C" are extracted by sampling the read threshold voltage distributions A', B', and C', and the heights and the widths of the pre-read threshold voltage distributions A", B", and C" are slightly smaller and narrower than the heights and the widths of the read threshold voltage distributions A', B', and C' while the pre-read threshold voltage distributions A", B", and C" have the same center values as the center values of the read threshold voltage distributions A', B', and C'. The upper limit of the pre-read threshold voltage distributions A", B", and C" is lower than the upper limit of the read threshold voltage distributions A', B', and C' in many cases. Similarly, the lower limit of the pre-read threshold voltage distributions A", B", and C" is higher than the lower limit of the read threshold voltage distributions A', B', and C' in many cases.

The pre-read operation is performed on the memory cells in the page Ppre for pre-reading as a target to be read, and the number of errors (the number of fail bits) CstateFBC in the read actual data is counted by the control unit 16 based on the parity data which is simultaneously read from the memory cells. The number of fail bits CstateFBC is an index for determining the data retention property of the memory cell. Then, the control unit 16 determines whether the number of fail bits CstateFBC is larger than a threshold value C_DR_FBC (CstateFBC>C_DR_FBC?) (Step S2). Here, the threshold voltage distribution C in which the data retention property is the worst is used for the determination. As a result, there is no need to count the number of fail bits of the threshold voltage distributions A and B, and thus, the read operation may be performed at a high speed. In addition, the control unit 16 may count the number of fail bits CstateFBC using the threshold voltage distributions A and B.

When it is determined that CstateFBC>C_DR_FBC, the procedure proceeds to Step S3, where shift amounts $\Delta A_{DR}$, $\Delta B_{DR}$, and $\Delta C_{DR}$ given to the read voltages VCG_AR3, VCG_BR3, and VCG_CR3 are determined (Step S3). The shift amounts $\Delta A_{DR}$, $\Delta B_{DR}$, and $\Delta C_{DR}$ may be determined based on the difference between the number of fail bits CstateFBC and the threshold value C_DR_FBC, or may be set to a fixed value irrespective of the difference. The shift amounts $\Delta A_{DR}$, $\Delta B_{DR}$, and $\Delta C_{DR}$ are generally set to have negative values.

When the shift amounts $\Delta A_{DR}$, $\Delta B_{DR}$, and $\Delta C_{DR}$ are determined, the control unit 16 sets added values VCG_AR3', VCG_BR3', and VCG_CR3', obtained by adding the shift amounts $\Delta A_{DR}$, $\Delta B_{DR}$, and $\Delta C_{DR}$ to the initial values VCG_AR3$_0$, VCG_BR3$_0$, and VCG_CR3$_0$ respectively, as read voltages VCG_AR3, VCG_BR3, and VCG_CR3 (Step S4), and performs an actual read operation using the read voltages VCG_AR3', VCG_BR3', and VCG_CR3' (Step S5).

On the other hand, when it is determined that CstateFBC=<C_DR_FBC in Step S2, the control unit 16 determines that there is no change of the threshold voltage due to the data retention property, and the procedure proceeds to Step S6. In Step S6, a change of the threshold voltage caused by a disturbance is mainly determined.

Figure 11B:
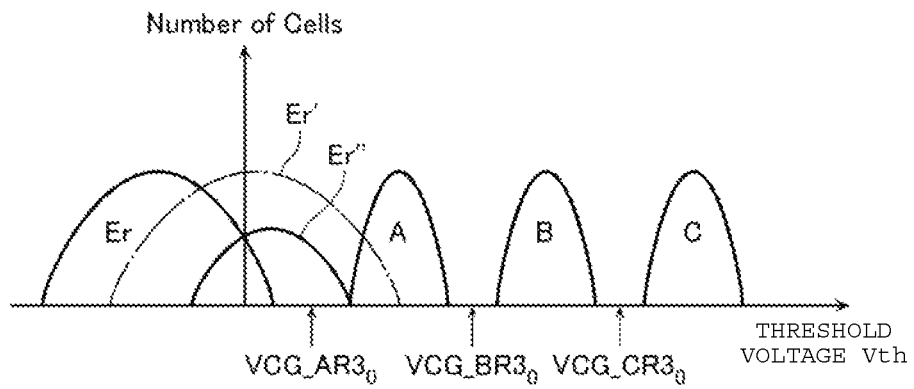
FIG. 11B is one example of a concept diagram illustrating the procedures of the read operation according to the first embodiment.

Here, as illustrated in FIG. 11B, the threshold voltage distribution of the memory cells in an erase state is formed like the threshold voltage distribution Er immediately after the write operation. Then, due to a disturbance caused by the write operation to other memory cells and the read operation from other memory cells, or the like, the threshold value distribution of the memory cells is moved from the threshold voltage distribution Er to a threshold voltage distribution Er' such that the distribution width is widened to a high voltage side.

As illustrated in FIG. 11B, the threshold voltage distribution of the page for pre-reading is changed to a distribution Er" (pre-read threshold voltage distribution) whose width is smaller than the width of the threshold voltage distribution Er' of the memory cells as a target to be read (read threshold voltage distribution). Here, the canter value of the pre-read threshold voltage distribution Er" is located at the substantially same position as the center value of the read threshold voltage distribution Er'. That is, the pre-read threshold voltage distribution Er" is extracted by sampling the read threshold voltage distribution Er', and the height and the width of the pre-read threshold voltage distribution Er" are slightly smaller and narrower than the height and the width of the read threshold voltage distribution while the pre-read threshold voltage distribution has the same center value as the center value of the read threshold voltage distribution Er'. The upper limit of the pre-read threshold voltage distribution Er" is lower than the upper limit of the read threshold voltage distribution Er' in many cases. Similarly, the lower limit of the pre-read threshold voltage distribution Er" is higher than the lower limit of the read threshold voltage distribution Er' in many cases.

In Step S6, the control unit 16 counts the number of memory cells (the number of fail bits) EstateFBC from which data other than the threshold voltage distribution Er" is read among the memory cells of the page Ppre for pre-reading to which the threshold voltage distribution Er" is given. The number of fail bits EstateFBC is an index for determining a disturbance property. The control unit 16 determines whether the number of fail bits EstateFBC is larger than a threshold value Er_RD_FBC (EstateFBC>Er_RD_FBC?) (Step S6).

When it is determined that EstateFBC=<Er_RD_FBC in Step S6, the control unit 16 controls the values of the read voltages VCG_AR3, VCG_BR3, and VCG_CR3 to be maintained at the initial values VCG_AR3$_0$, VCG_BR3$_0$, and VCG_CR3$_0$, and the procedure proceeds to an actual read operation (Step S5). In the actual read operation, the above-described page Ppre for pre-reading is also set as a target to be read and the actual data stored in the page Ppre for pre-reading is also read during the actual read operation.

On the other hand, when it is determined that EstateFBC>Er_RD_FBC in Step S6, the procedure proceeds to Step S7, and shift amounts $\Delta A_{RD}$, $\Delta B_{RD}$, and $\Delta C_{RD}$ given to the read voltages VCG_AR3, VCG_BR3, and VCG_CR3 are determined (Step S7). The shift amounts $\Delta A_{RD}$, $\Delta B_{RD}$, and $\Delta C_{RD}$ may be determined based on the difference between the number of fail bits EstateFBC and the threshold value Er_RD_FBC, or may be set to a fixed value irrespective of the difference. The shift amounts $\Delta A_{RD}$, $\Delta B_{RD}$, and $\Delta C_{RD}$ are set to have positive values so that the relationship of $\Delta A_{RD} > \Delta B_{RD} > \Delta C_{RD}$ may be set.

When the shift amounts $\Delta A_{RD}$, $\Delta B_{RD}$, and $\Delta C_{RD}$ are determined, the control unit 16 sets added values VCG_AR3', VCG_BR3', and VCG_CR3', obtained by adding the shift amounts $\Delta A_{RD}$, $\Delta B_{RD}$, and $\Delta C_{RD}$ to the initial values VCG_AR3$_0$, VCG_BR3$_0$, and VCG_CR3$_0$ respectively, as read voltages VCG_AR3, VCG_BR3, and VCG_CR3 (Step S8), and performs an actual read operation using the read voltages VCG_AR3', VCG_BR3', and VCG_CR3' (Step S5).

Effects

Next, the effects of the first embodiment will be described. According to the first embodiment, before the actual read operation from the memory cells set as a target to be read and arranged along one word line WL, the pre-read operation of reading some memory cells among the memory cells arranged along the word line WL, for example, the page Ppre for pre-reading, is performed, and the read voltages VCG_AR3, VCG_BR3, and VCG_CR3 used in the actual read operation are determined based on the read result of the pre-read operation. According to the procedure, the degree of change in the threshold voltage distribution is determined by the pre-read operation, and read voltages VCG_AR3, VCG_BR3, and VCG_CR3 are properly set according to the determination result. Accordingly, it is possible to improve the reliability of data stored in the memory cells. In addition, a retry read rate may be reduced.

Further, the number of memory cells to be read in the pre-read operation is smaller than a total number of memory cells to be read. That is, the time for counting the number of fail bits is shorter in the pre-read operation than in the operation for reading all the memory cells. Therefore, it is possible to reduce a retry read rate with accuracy and at a high speed by performing sampling from the memory cells to be read.

Second Embodiment

Figure 13:
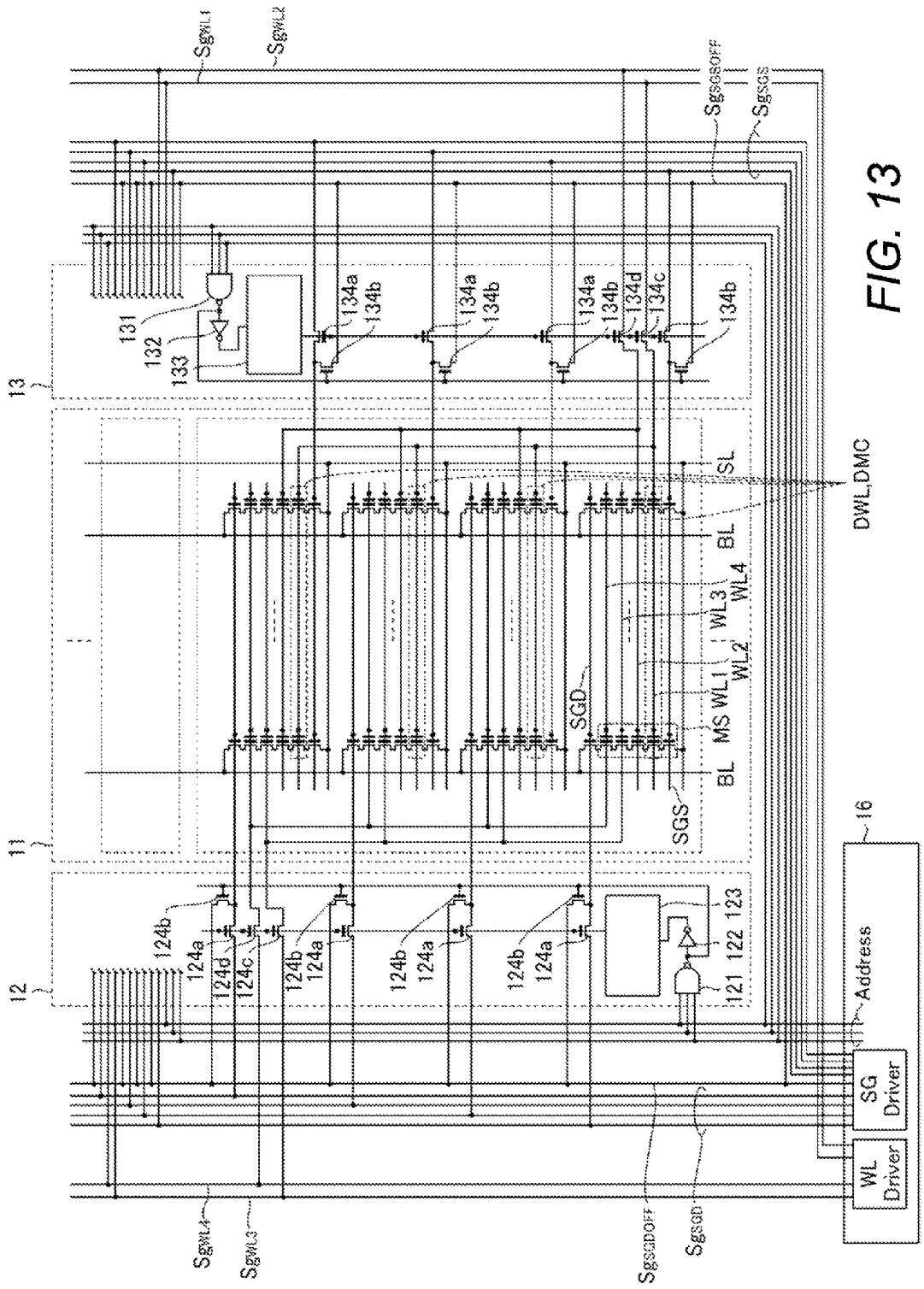
FIG. 13 is one example of a circuit diagram of a nonvolatile semiconductor memory device according to a second embodiment.

Next, referring to FIG. 13, a nonvolatile semiconductor memory device according to a second embodiment will be described. FIG. 13 illustrates the overall configuration of the nonvolatile semiconductor memory device according to the second embodiment. In the nonvolatile semiconductor memory device according to the second embodiment, the memory transistors adjacent to the drain-side selection transistors SDTr or the source-side selection transistors SSTr are set as dummy memory cells DMC that are not used as memory cells for retaining normal data. Dummy word lines DWL are connected to the dummy memory cells DMC. In the second embodiment, some of the dummy memory cells DMC are set as the above-described page for pre-reading. The others are the same as those of the first embodiment. The data stored in the dummy memory cells DMC is dummy data. Therefore, the dummy memory cells DMC are not set as a target to be read in the actual read operation. For example, it is possible to store the number of writing times in the dummy memory cells DMC.

In addition, for example, a data pattern for pre-reading is stored in the dummy memory cells. Specifically, the level of the threshold voltage Er is stored in the dummy memory cells DMC connected to a certain dummy word line DWL and the threshold voltage C is stored in the dummy memory cells DMC connected to another dummy word line DWL. Here, the control unit 16 performs determination in Steps S2 and S6 in FIG. 12 by only using the data in the dummy memory cells DMC as data for pre-reading. As a result, since the data (threshold voltage) in the dummy memory cells is known unlike random actual data, it is possible to accurately count the number of fail bits.

Third Embodiment

Figure 14:
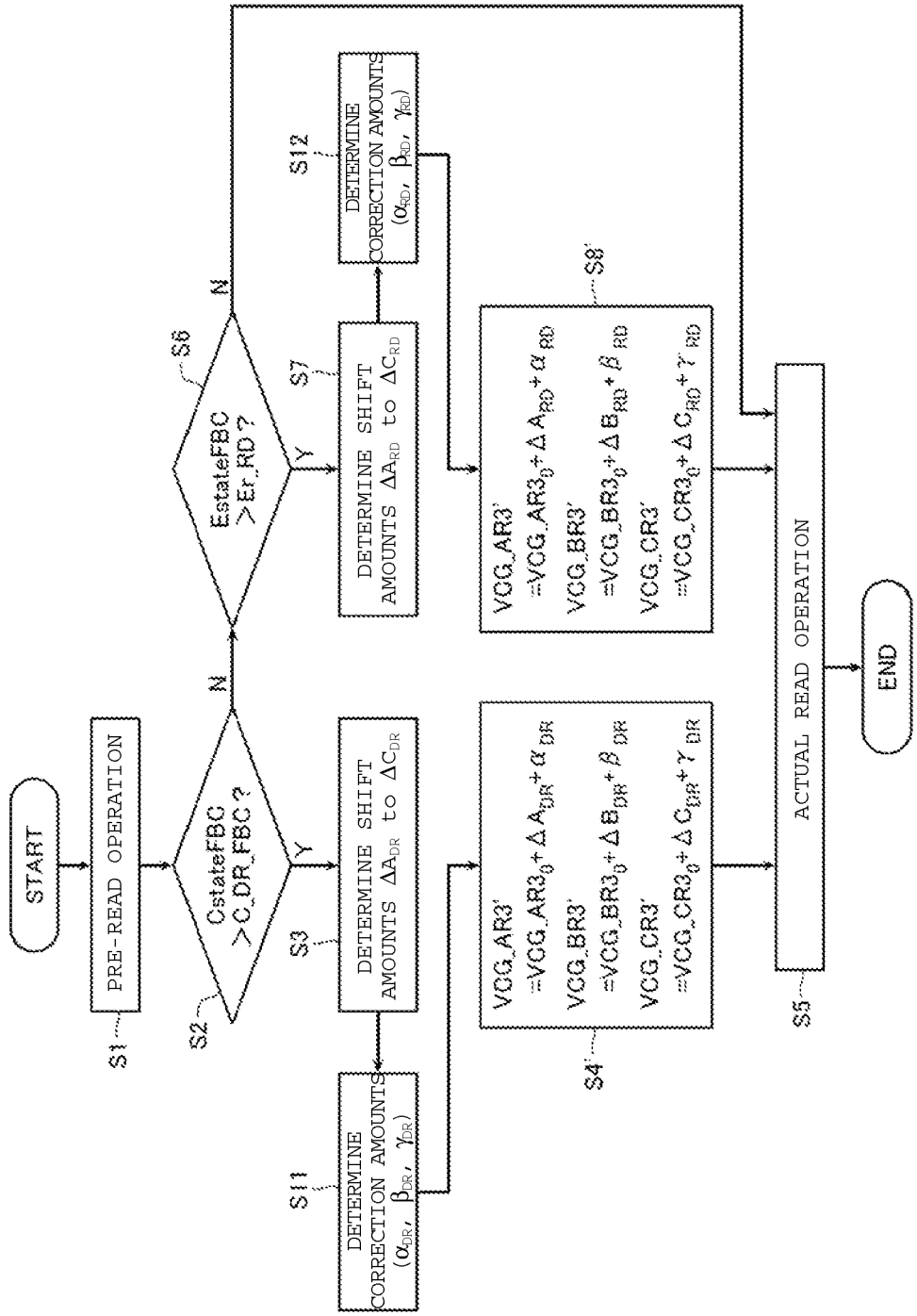
FIG. 14 is one example of a flow chart illustrating procedures of a read operation according to a third embodiment.

Next, referring to FIG. 14, a nonvolatile semiconductor memory device according to a third embodiment will be described. Since the configuration of the nonvolatile semiconductor memory device according to the third embodiment is substantially the same as the configuration of the first embodiment (FIGS. 1 to 5), redundant description thereof will be omitted. The same steps as those of the first embodiment (FIG. 12) are denoted by the same reference numerals, and thus, redundant description thereof will be omitted.

In the third embodiment, the shift amounts $\Delta A_{DR}$ to $\Delta C_{DR}$, and $\Delta A_{RD}$ to $\Delta C_{RD}$ are determined and also, correction amounts $\alpha_{DR}$, $\beta_{DR}$ and $\gamma_{DR}$, and/or $\alpha_{RD}$, $\beta_{RD}$ and $\gamma_{RD}$ are determined. The correction amounts are added to the initial values of the read voltage VCG_AR3$_0$, VCG_BR3$_0$, and VCG_CR3$_0$ together with the shift amounts $\Delta A_{DR}$ to $\Delta C_{DR}$, and $\Delta A_{RD}$ to $\Delta C_{RD}$, and are used to calculate new read voltages VCG_AR3', VCG_BR3', and VCG_CR3'. For example, the correction amounts $\alpha_{DR}$, $\beta_{DR}$, and $\gamma_{DR}$, and $\alpha_{RD}$, $\beta_{RD}$, and $\gamma_{RD}$ are determined based on cumulative number of write and erase operations performed $N_{EW}$, the height of the selected word line WL set as a target to be read in the stacking direction, the diameter of the semiconductor layer 35 in the memory cells MC to which the selected word line WL is connected, and other information which has influence on a change of the threshold voltage distribution. Alternatively, the correction amounts may be determined based on a combination of plural types of information.

The correction amounts $\alpha_{DR}$, $\beta_{DR}$ and $\gamma_{DR}$, and $\alpha_{RD}$, $\beta_{RD}$, and $\gamma_{RD}$ may be stored in a ROM region of the nonvolatile semiconductor memory device 100. In addition, the correction amounts $\alpha_{DR}$, $\beta_{DR}$, and $\gamma_{DR}$, and $\alpha_{RD}$, $\beta_{RD}$, and $\gamma_{RD}$ may be retained by a memory controller HM or the like to transmit the correction amounts to the nonvolatile semiconductor memory device 100 as a command.

In this manner, even when the stacking position of the selected word line WL is different, the data in the selected memory cells MC may be read correctly by using the correction amounts $\alpha_{DR}$, $\beta_{DR}$, and $\gamma_{DR}$, and $\alpha_{RD}$, $\beta_{RD}$ and $\gamma_{RD}$.

Fourth Embodiment

Next, referring to FIGS. 15A and 15B, a nonvolatile semiconductor memory device according to a fourth embodiment will be described. Since the configuration of the nonvolatile semiconductor memory device according to the fourth embodiment is substantially the same as the configuration of the first embodiment (FIGS. 1 to 5), redundant description thereof will be omitted. However, in the fourth embodiment, shift amounts of read voltages of all of other word lines (for example, word lines WL2 to WL4) are set based on the result of the pre-read operation from a certain word line (for example, a word line WL1) in one memory block MB.

Specific details of a read operation in the fourth embodiment will be described with reference to FIGS. 15A and 15B.

Figures 15A, 15B:
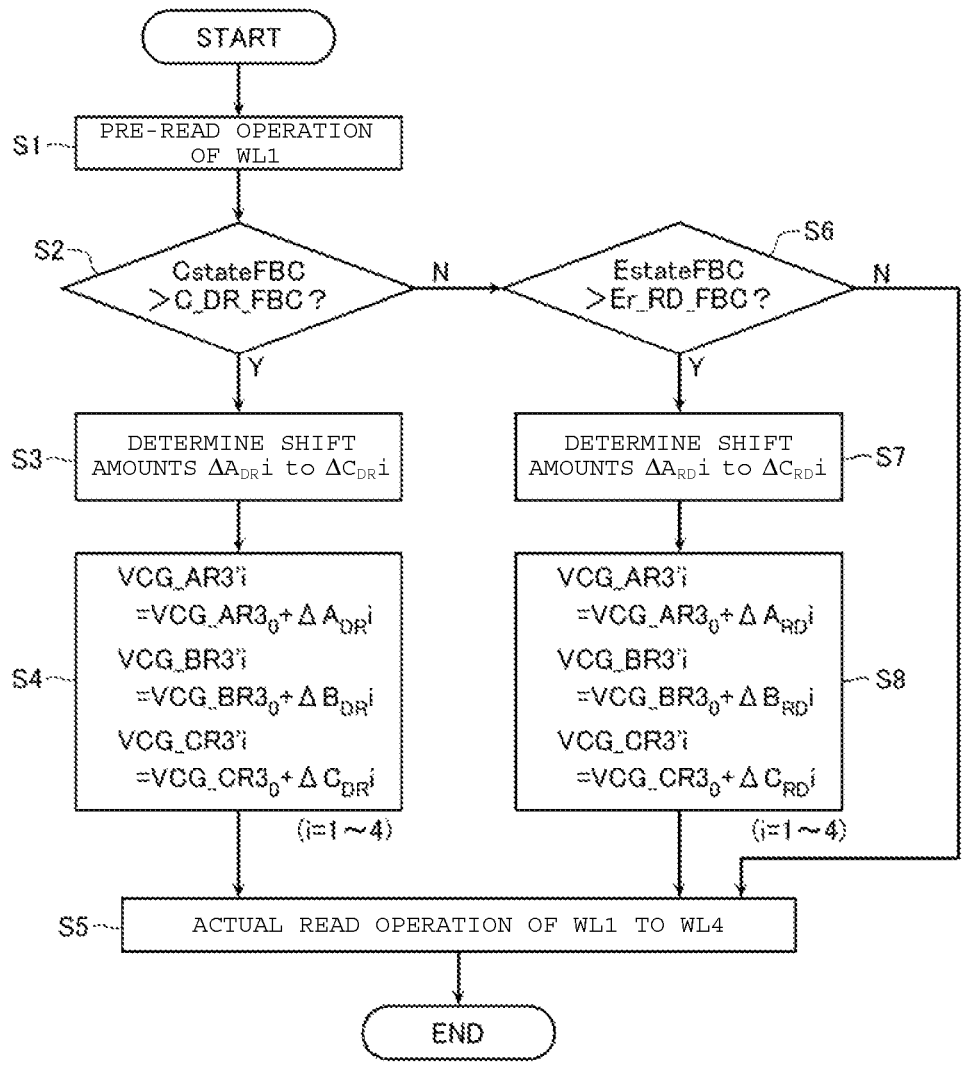
FIG. 15A is one example of a diagram schematically illustrating procedures of a read operation according to a fourth embodiment.
FIG. 15B is one example of a flow chart illustrating the procedures of the read operation according to the fourth embodiment.

First, before the description of a read operation is started, referring to FIG. 15A, the read voltage applied to the word lines WL1 to WL4 at the time of a read operation will be defined. When the word line WL1 is selected and a read operation is performed, read voltages VCG_AR31, VCG_BR31, and VCG_CR31 are sequentially applied to the word line WL1 (a read pass voltage Vread is applied to other unselected word lines WL2 to WL4). When the word line WL2 is selected and a read operation is performed, read voltages VCG_AR32, VCG_BR32, and VCG_CR32 are sequentially applied to the word line WL2 (a read pass voltage Vread is applied to other unselected word lines WL1, WL3, and WL4).

When the word line WL3 is selected and a read operation is performed, read voltages VCG_AR33, VCG_BR33, and VCG_CR33 are sequentially applied to the word line WL3 (a read pass voltage Vread is applied to other unselected word lines WL1, WL2, and WL4). When the word line WL4 is selected and a read operation is performed, read voltages VCG_AR34, VCG_BR34, and VCG_CR34 are sequentially applied to the word line WL4 (a read pass voltage Vread is applied to other unselected word lines WL1 to WL3).

When the read voltages are applied as described above, in the read operation of the exemplary embodiment, a pre-read operation and an actual read operation will be performed by the following procedures.

As illustrated in FIG. 15B, in a pre-read operation (Step S1 in FIG. 14), initially, the read voltages VCG_AR31, VCG_BR31, and VCG_CR31 are set as initial values VCG_AR3$_0$ VCG_BR3$_0$ and VCG_CR3$_0$, and then, the memory cells (the page Ppre for pre-reading) set as a target of the pre-read operation and connected to the word line WL1, are read. In the memory cells of the page Ppre for pre-reading, actual data and parity data for error detection are stored in advance.

The pre-read operation is performed on the page Ppre for pre-reading as a target, and the number of errors (the number of fail bits) CstateFBC in the read actual data is counted by the control unit 16 based on the parity data which is simultaneously read from the memory cells. Then, the control unit 16 determines whether the number of fail bits CstateFBC is larger than a threshold value C_DR_FBC (CstateFBC>C_DR_FBC?) (Step S2). Here, instead of performing determination in Step S2 using the threshold voltage distribution C as in the first embodiment, the control unit may count the number of fail bits CstateFBC using the threshold voltage distributions A and B.

When it is determined that CstateFBC>C_DR_FBC, the procedure proceeds to Step S3, shift amounts $\Delta A_{DR}i$, $\Delta B_{DR}i$, and $\Delta C_{DR}i$ (i=1 to 4) given to read voltages VCG_AR3$i$, VCG_BR3$i$, and VCG_CR3$i$ (i=1 to 4) are determined (Step S3). That is, shift amounts are respectively determined with respect to all the word lines WL1 to WL4.

The shift amounts $\Delta A_{DR}1$, $\Delta A_{DR}2$, $\Delta A_{DR}3$, and $\Delta A_{DR}4$ are shift amounts that are given to the read voltage VCG_AR3$i$ (i=1 to 4) when an actual read operation is performed on the memory cells arranged along the respective word lines WL1, WL2, WL3, and WL4, and the shift amounts may have different values. The differences among the shift amounts $\Delta A_{DR}1$, $\Delta A_{DR}2$, $\Delta A_{DR}3$, and $\Delta A_{DR}4$ are determined, for example, according to the degree of change in the diameter of the semiconductor layer 35 in the stacking direction. For example, when the semiconductor layer 35 has a reverse tapered shape, the shift amounts $\Delta A_{DR}1$, $\Delta A_{DR}2$, $\Delta A_{DR}3$, and $\Delta A_{DR}4$ are set to have a relationship of $\Delta A_{DR}1 < \Delta A_{DR}2 < \Delta A_{DR}3 < \Delta A_{DR}4$ in many cases.

In the same manner, shift amounts $\Delta B_{DR}1$, $\Delta B_{DR}2$, $\Delta B_{DR}3$, and $\Delta B_{DR}4$ are shift amounts that are given to the read voltage VCG_BR3$i$ (i=1 to 4) when an actual read operation from the memory cells arranged along the respective word lines WL1, WL2, WL3, and WL4 is performed, and may have different values from each other. For example, the differences among the shift amounts $\Delta B_{DR}1$, $\Delta B_{DR}2$, $\Delta B_{DR}3$, and $\Delta B_{DR}4$ are determined according to the degree of change in the diameter of the semiconductor layer 35 in the stacking direction.

In addition, shift amounts $\Delta C_{DR}1$, $\Delta C_{DR}2$, $\Delta C_{DR}3$, and $\Delta C_{DR}4$ are shift amounts that are given to the read voltage VCG_CR3$i$ (i=1 to 4) when an actual read operation from the memory cells arranged along the respective word lines WL1, WL2, WL3, and WL4 is performed, and may have different values from each other. For example, the differences among the shift amounts $\Delta C_{DR}1$, $\Delta C_{DR}2$, $\Delta C_{DR}3$, and $\Delta C_{DR}4$ are determined according to the degree of change in the diameter of the semiconductor layer 35 in the stacking direction.

The shift amounts $\Delta A_{DR}i$, $\Delta B_{DR}i$, and $\Delta C_{DR}i$ (i=1 to 4) may be determined based on the difference between the number of fail bits CstateFBC and the threshold value C_DR_FBC, as in the above-described embodiment, or may be set to a fixed value irrespective of the difference. The shift amounts $\Delta A_{DR}i$, $\Delta B_{DR}i$, and $\Delta C_{DR}i$ are generally set to have negative values.

When the shift amounts $\Delta A_{DR}i$, $\Delta B_{DR}i$, and $\Delta C_{DR}i$ are determined, the control unit 16 sets added values VCG_AR3'$i$, VCG_BR3'$i$, and VCG_CR3'$i$, obtained by adding the shift amounts $\Delta A_{DR}i$, $\Delta B_{DR}i$, and $\Delta C_{DR}i$ to the initial values VCG_AR3$_0$, VCG_BR3$_0$, and VCG_CR3$_0$ respectively, as read voltages VCG_AR3$i$, VCG_BR3$i$, and VCG_CR3$i$ (Step S4), and performs an actual read operation using the read voltages VCG_AR3'$i$, VCG_BR3'$i$, and VCG_CR3'$i$ (Step S5).

On the other hand, when it is determined that CstateFBC=<C_DR_FBC in Step S2, the control unit 16 determines that there is no change of the threshold voltage due to the data retention property, and the procedure proceeds to Step S6. In Step S6, a change of the threshold voltage caused by a disturbance is mainly determined. In Step S6, the control unit counts the number of memory cells (the number of fail bits) EstateFBC from which data other than the threshold voltage distribution Er is read among the memory cells of the page Ppre for pre-reading to which the threshold voltage distribution Er is given. The number of fail bits EstateFBC is an index for determining a disturbance property. The control unit 16 determines whether the number of fail bits EstateFBC is larger than a threshold value Er_RD_FBC (EstateFBC>Er_RD_FBC?) (Step S6).

When it is determined that EstateFBC=<Er_RD_FBC in Step S6, the control unit 16 controls the values of the read voltages VCG_AR3$i$, VCG_BR3$i$, and VCG_CR3$i$ to be maintained at the initial values VCG_AR3$_0$, VCG_BR3$_0$, and VCG_CR3$_0$, and the procedure proceeds to an actual read operation (Step S5). The read voltages VCG_AR3$i$, VCG_BR3$i$, and VCG_CR3$i$ applied to each word line WL in the actual read operation may be changed for each word line WL according to different determination criteria from the above-described determination criteria of the shift amount.

Meanwhile, when it is determined that EstateFBC>Er_RD_FBC in Step S6, the procedure proceeds to Step S7, and the shift amounts $\Delta A_{RD}i$, $\Delta B_{RD}i$, and $\Delta C_{RD}i$ that are given to the read voltages VCG_AR3$i$, VCG_BR3$i$, and VCG_CR3$i$ are determined (Step S7). The shift amounts $\Delta A_{RD}i$, $\Delta B_{RD}i$, and $\Delta C_{RD}i$ may be determined based on the difference between the number of fail bits EstateFBC and the threshold value Er_RD_FBC, and may be set to a fixed value irrespective of the difference.

When the shift amounts $\Delta A_{RD}i$, $\Delta B_{RD}i$, and $\Delta C_{RD}i$ are determined, the control unit 16 sets added values VCG_AR3'$i$, VCG_BR3'$i$, and VCG_CR3'$i$, obtained by adding the shift amounts $\Delta A_{RD}i$, $\Delta B_{RD}i$, and $\Delta C_{RD}i$ to the initial values VCG_AR3$_0$, VCG_BR3$_0$, and VCG_CR3$_0$ respectively, as read voltages VCG_AR3$i$, VCG_BR3$i$, and VCG_CR3$i$ (Step S8), and performs an actual read operation of the word lines WL1 to WL4 using the read voltages VCG_AR3'$i$, VCG_BR3'$i$, and VCG_CR3'$i$ (Step S5).

Effects

Next, the effects of the fourth embodiment will be described. According to the fourth embodiment, the pre-read operation from the memory cells connected to one word line WL is performed and the read voltages VCG_AR3$i$, VCG_BR3$i$, and VCG_CR3$i$ used in the actual read operation of the respective word lines WL in the memory block are determined based on the read result of the pre-read operation. According to the procedure, it is possible to obtain the same effects as in the above-described embodiment. In addition, the pre-read operation of the word lines WL2 to WL4 may be omitted and thus, the performance of the device may be further improved.

Fifth Embodiment

Next, referring to FIG. 16, a nonvolatile semiconductor memory device according to a fifth embodiment will be described. Since the configuration of the nonvolatile semiconductor memory device according to the fifth embodiment is substantially the same as the configuration of the first embodiment (FIGS. 1 to 5), redundant description thereof will be omitted.

Figure 16:
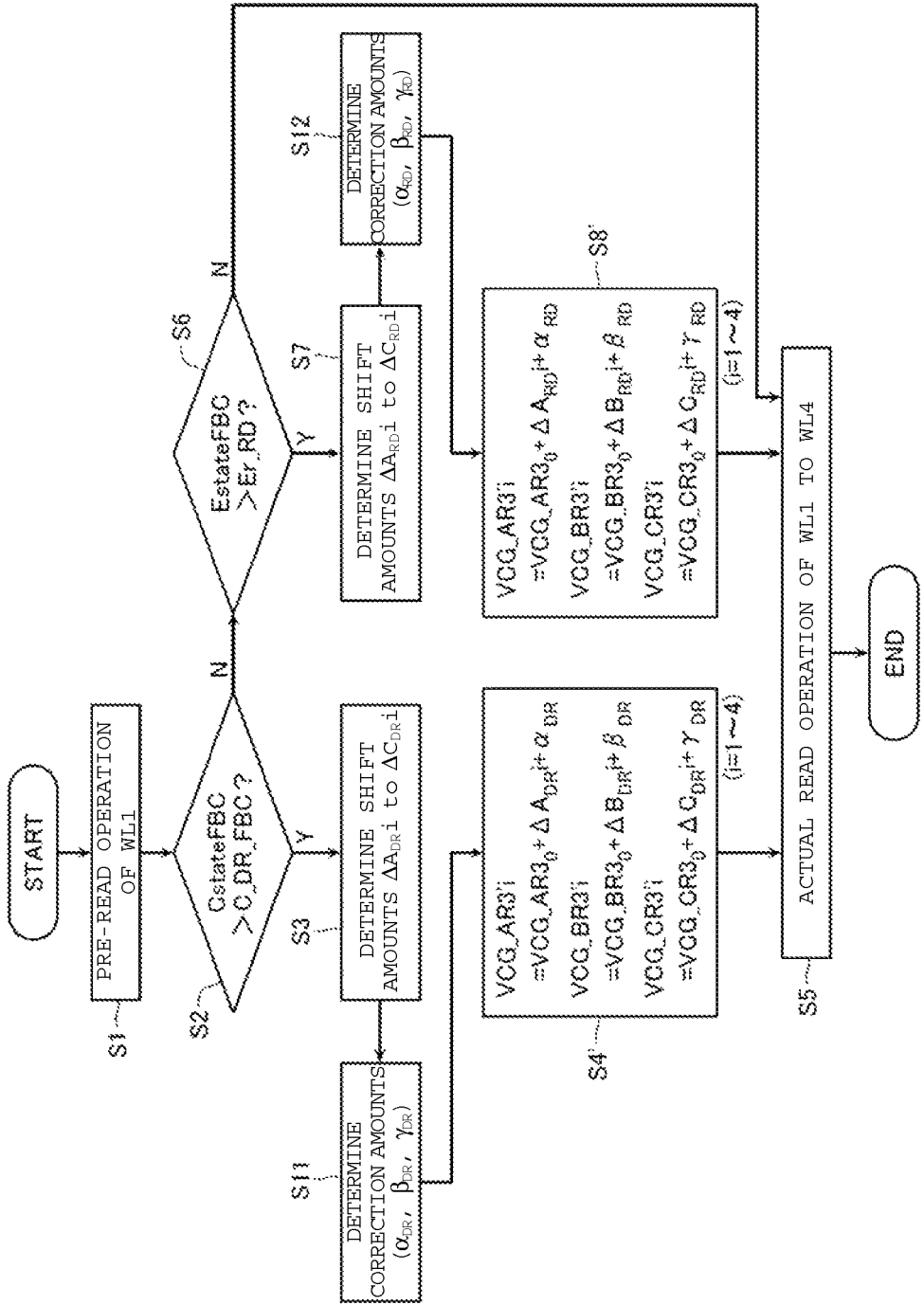
FIG. 16 is one example of a flow chart illustrating procedures of a read operation according to a fifth embodiment.

FIG. 16 is a flow chart illustrating procedures of a read operation in the exemplary embodiment. In FIG. 16, the same procedures as in FIG. 15B will be denoted by the same reference numerals, and thus, redundant description thereof will be omitted.

In the fifth embodiment, as in the fourth embodiment, a pre-read operation is performed on a certain word line (for example, a word line WL1) in one memory block MB, and shift amounts of read voltages of word lines (for example, word lines WL2 to WL4) other than the word line are set according to the result of the pre-read operation.

However, the fifth embodiment is different from the fourth embodiment in that correction amounts $\alpha_{DR}$, $\beta_{DR}$, and $\gamma_{DR}$ and/or $\alpha_{RD}$, $\beta_{RD}$, and $\gamma_{RD}$ are determined as in the third embodiment. The others are the same as those of the fourth embodiment.

Sixth Embodiment

Next, referring to FIGS. 17 and 18, a nonvolatile semiconductor memory device according to a sixth embodiment will be described. Since the configuration of the nonvolatile semiconductor memory device according to the sixth embodiment is substantially the same as the configuration of the first embodiment (FIGS. 1 to 5), redundant description thereof will be omitted.

In the sixth embodiment, a method of a pre-read operation that is performed before a read operation is performed, is different from that of the above-described embodiments. Specifically, in the sixth embodiment, a read voltage applied to a selected word line is gradually changed to determine the overlapping state of plural threshold voltage distributions and the voltage of a cross section (cross point) when the distributions are overlapped with each other in a pre-read operation. The data retention property and the disturbance property of the memory cell are determined according to the determination result, and shift amounts $\Delta A_{DR}$ to $\Delta C_{DR}$ and $\Delta A_{RD}$ to $\Delta C_{RD}$ are determined.

Figure 17:
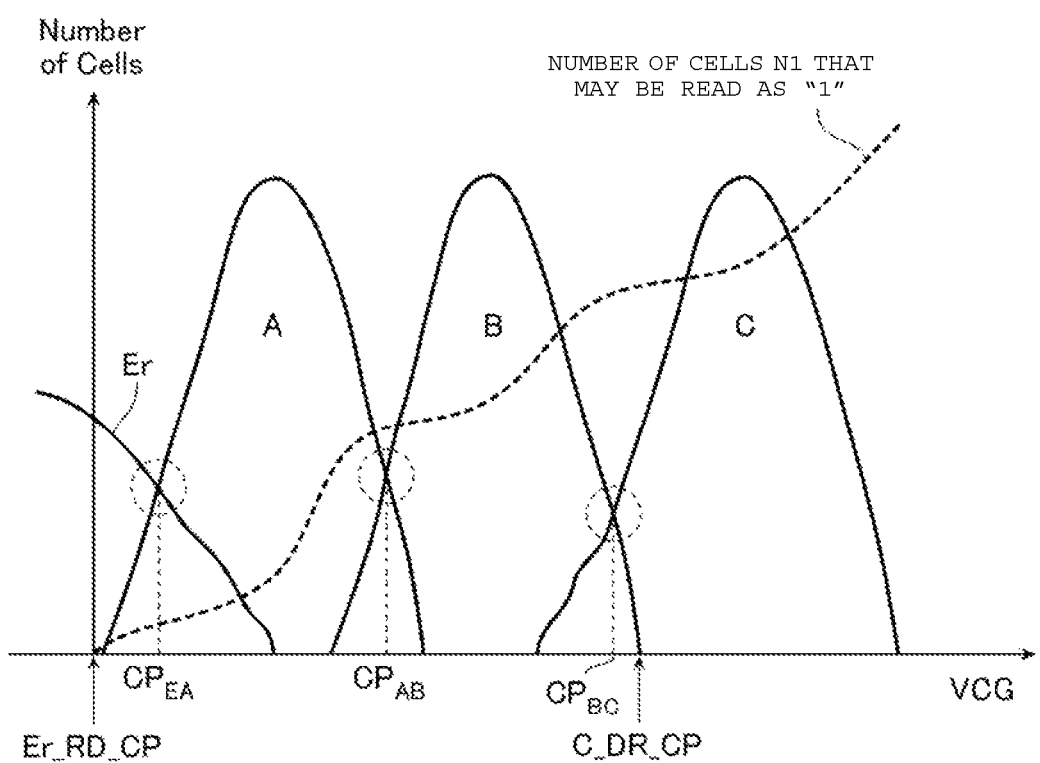
FIG. 17 is one example of a graph illustrating a method of a read operation according to a sixth embodiment.

Referring to FIG. 17, a method of determining a cross point will be described. The threshold voltage distributions Er, A, B, and C are changed and cross points $CP_{EA}$, $CP_{AB}$, and $CP_{BC}$ are generated as illustrated in FIG. 17. At this time, the read voltage VCG applied to the selected word line is changed and a read operation is performed to count the number of memory cells determined to retain data "1" (memory cells having a lower threshold voltage than the read voltage).

The higher the read voltage VCG is, the more the number of memory cells N1 determined to retain data "1" increases (see FIG. 17). Here, the number N1 may refer to the number of memory cells MC whose threshold voltage is lower than the voltage VCG. An increase in the number N1 is decelerated around the cross points $CP_{EA}$, $CP_{AB}$, and $CP_{BC}$. Accordingly, it is possible to detect voltages in which the cross points $CP_{EA}$, $CP_{AB}$, and $CP_{BC}$ are generated by determining the degree of change in the number N1.

Here, the control circuit compares the cross points $CP_{EA}$, $CP_{AB}$, and $CP_{BC}$ with threshold values. Based on the comparison results, the data retention property and the disturbance property of the memory cell may be determined.

Next, referring to the flow chart in FIG. 18, the procedures of the pre-read operation and the actual read operation in the sixth embodiment will be described. The same steps as those of the first embodiment are denoted by the same reference numerals, and thus, redundant description thereof will be omitted.

In a pre-read operation in Step S1, the pre-read operation illustrated in FIG. 17 is performed to determine a cross point. Here, an example in which two cross points $CP_{EA}$ and $CP_{BC}$ illustrated in FIG. 17 are determined will be described. The cross point $CP_{BC}$ is used for determination of a data retention property, and the cross point $CP_{EA}$ is used for determination of a disturbance property.

When it is determined that $CP_{BC}$ is smaller than a threshold value C_DR_CP in Step S2, the procedure proceeds to Step S3, and shift amounts $\Delta A_{DR}$, $\Delta B_{DR}$, and $\Delta C_{DR}$ given to the read voltages VCG_AR3, VCG_BR3, and VCG_CR3 are determined (Step S3).

On the other hand, when it is not determined that $CP_{BC}$<C_DR_CP in Step S2, the procedure proceeds to Step S6, and whether $CP_{EA}$ is larger than a threshold value Er_RD_CP is determined. When it is determined that $CP_{EA}$=<Er_RD_CP, the control unit 16 controls the read voltages VCG_AR3, VCG_BR3, and VCG_CR3 to be maintained at the initial values VCG_AR3$_0$, VCG_BR3$_0$, and VCG_CR3$_0$, and the procedure proceeds to an actual read operation (Step S5).

On the other hand, when it is determined that $CP_{EA}$>Er_RD_CP in Step S6, the procedure proceeds to Step S7, and shift amounts $\Delta A_{RD}$, $\Delta B_{ED}$, and $\Delta C_{RD}$ that are given to the read voltages VCG_AR3, VCG_BR3, and VCG_CR3 are determined (Step S7). This procedure is the same as in the first embodiment.

Figure 18:
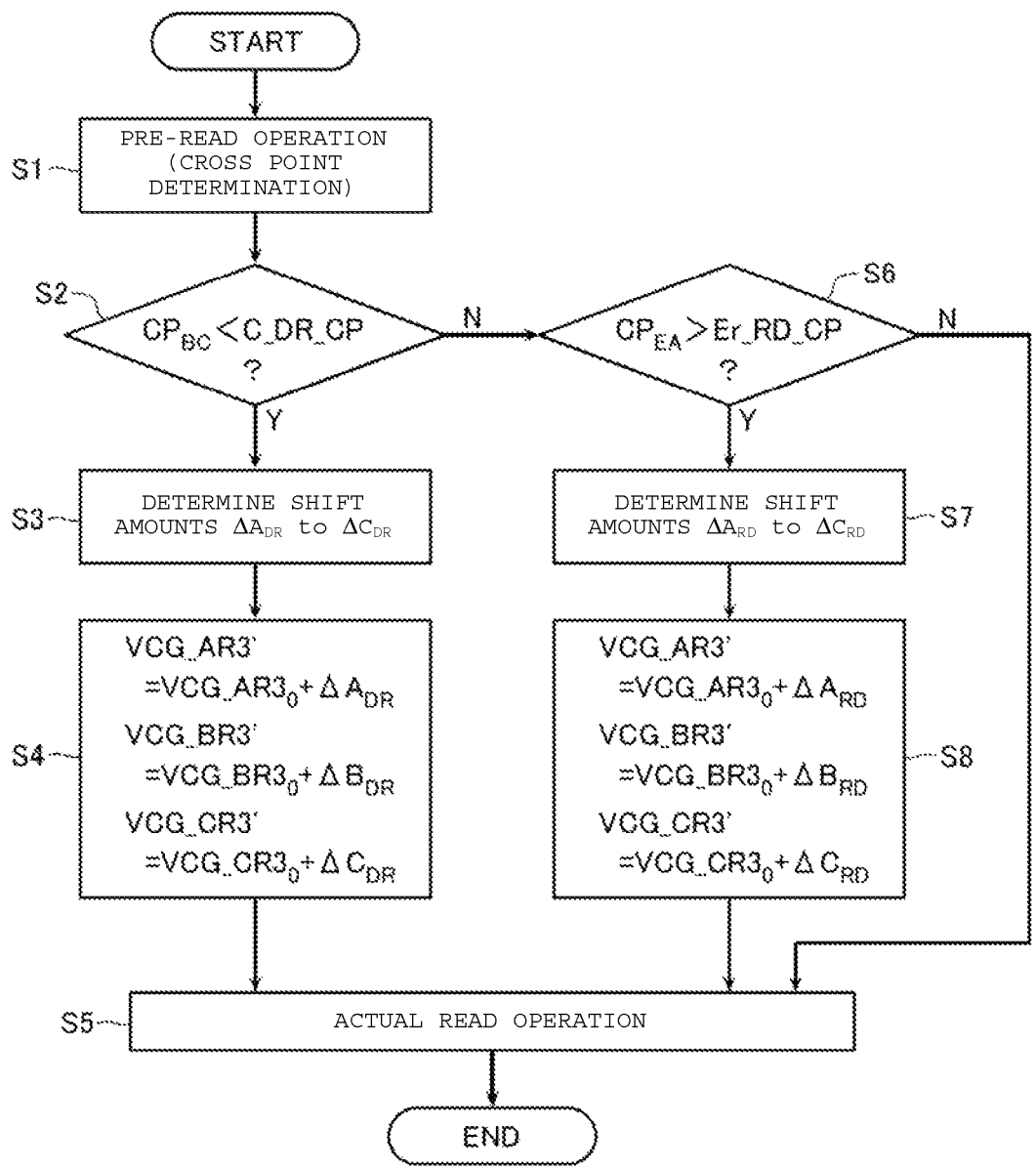
FIG. 18 is one example of a flow chart illustrating procedures of the read operation according to the sixth embodiment.

In FIG. 18, the procedures of determining the cross points $CP_{EA}$ and $CP_{BC}$ are described, but it is needless to say that the cross point $CP_{AB}$ may be determined, instead of the cross point $CP_{BC}$, or in addition to the cross point $CP_{BC}$.

As described above, according to the sixth embodiment, in the pre-read operation, the cross points of the threshold voltage distributions are determined and the shift amount of the read voltage in the actual read operation is determined based on the determination results. The same effects as in the above-described embodiments may be obtained by this embodiment.

Other Embodiment

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 19:
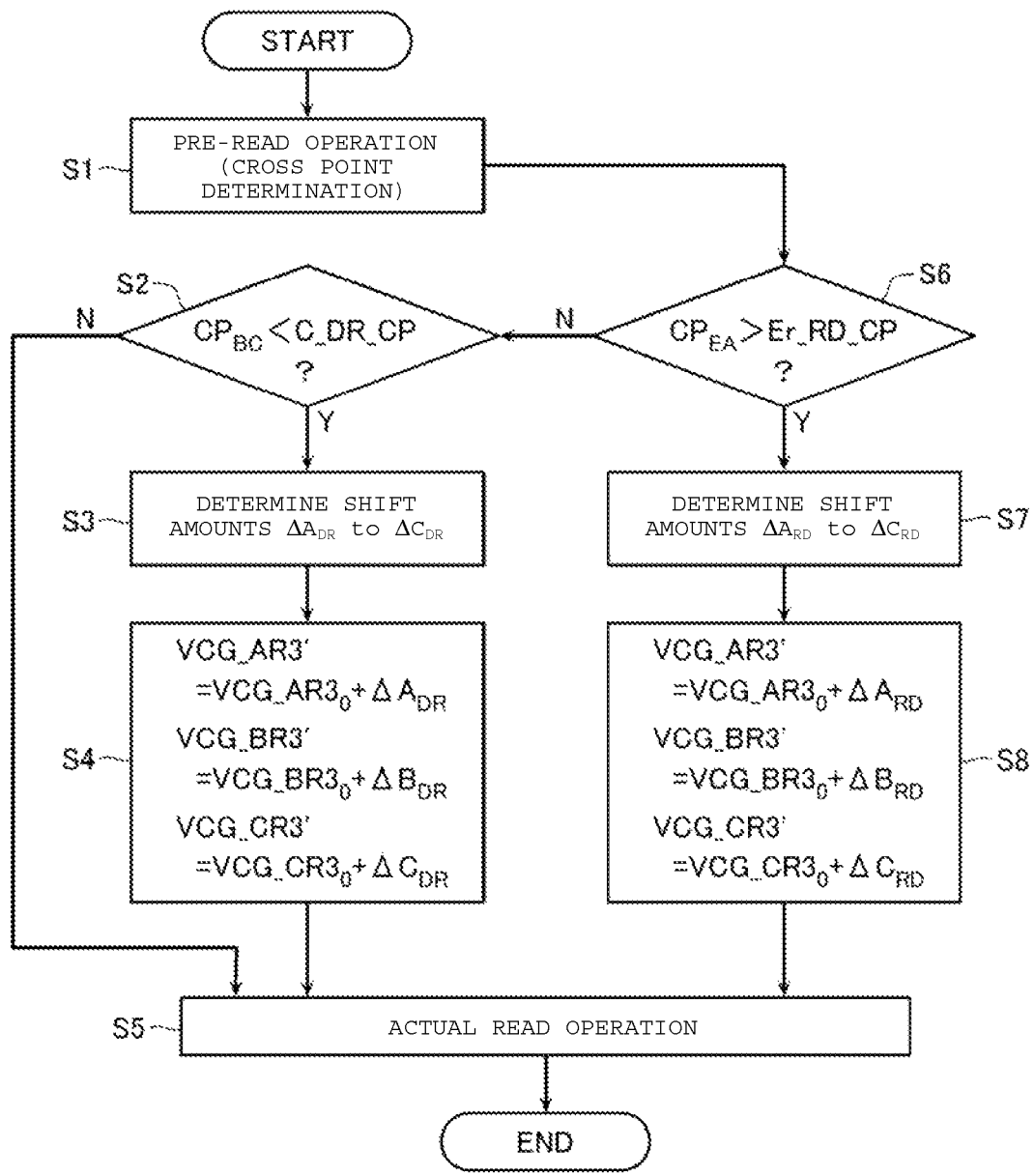
FIG. 19 illustrates a modification of the first embodiment.

For example, as illustrated in FIG. 19, the positions of Step S2 and Step S6 may be changed in the first embodiment. Similarly, the positions of Step S2 and Step S6 may be changed in the second to sixth embodiments.

For example, in the above-described embodiments, different shift amounts for each word line are added to the read voltages. However, groups for each plural word lines are formed and the same shift amount may be added to each group.

In the above-described embodiments, as an example of the nonvolatile semiconductor memory device, the NAND type flash memory having a three-dimensional structure in which the semiconductor layer 35 extends linearly is used, but the disclosure is not limited thereto. The above-described technology may be also applied to a NAND type flash memory in which the semiconductor layer 35 extends in a U-shape.

In the above-described embodiments, in the pre-read operation, the data of the page Ppre for pre-reading is read and the number of fail bits is counted to determine the degree of change in the threshold voltage distribution. However, there is no limitation thereto. For example, in the pre-read operation, the shape of threshold voltage distribution of the memory cell in the page Ppre for pre-reading itself may be determined.

What is claimed is:

1. A nonvolatile semiconductor memory device comprising:
a memory cell array including a plurality of memory cells; and
a control circuit for the memory cell array,
wherein the control circuit is configured to perform a pre-read operation to read pre-selected memory cells before a read operation on target memory cells is performed and to change a read voltage to be applied to the target memory cells during the read operation based on a result of the pre-read operation, and
wherein the pre-selected memory cells include none or less than all of the target memory cells.

2. The device according to claim 1,
wherein the pre-selected memory cells include some of the target memory cells.

3. The device according to claim 1,
wherein the memory cell array includes dummy memory cells that are different from the target memory cells, and
the dummy memory cells are set as the pre-selected memory cells to be read in the pre-read operation.

4. The device according to claim 1,
wherein the control circuit is configured to correct an amount of the read voltage changed during the read operation based on a total number of write or erase operations performed on the memory cell array.

5. The device according to claim 1, further comprising:
word lines stacked on a substrate, each of the word lines connected to a different group of memory cells,
wherein the control circuit is configured to correct an amount of the read voltage changed during the read operation according to a distance from the substrate of the word line that is connected to the target memory cells.

6. The device according to claim 1,
wherein the memory cells each have a semiconductor layer, and
the control circuit is configured to correct the amount of the read voltage changed during the read operation according to diameters of the semiconductor layers of the target memory cells.

7. The device according to claim 1,
wherein the number of fail bits is counted during the pre-read operation, and
a read voltage to be applied to the memory cells during the read operation is changed according to the number of fail bits.

8. The device according to claim 1,
wherein during the pre-read operation, the read voltage is gradually changed, and
the read voltage to be applied to the memory cells during the read operation is changed according to a rate of increase in the number of memory cells having a threshold voltage lower than the read voltage, as the read voltage is gradually changed.

9. A nonvolatile semiconductor memory device comprising:
a memory cell array including a plurality of memory cells, each of the memory cells having a semiconductor layer; and
a control circuit for the memory cell array,
wherein the control circuit is configured to perform a pre-read operation to read pre-selected memory cells before a first read operation on a first group of target memory cells is performed and a second read operation on a second group of target memory cells is performed, and to change a read voltage to be applied to the first group of memory cells during the first read operation and the second group of memory cells during the second read operation, based on a result of the pre-read operation and diameters of the semiconductor layers of the first and second groups of memory cells.

10. The device according to claim 9, wherein the diameters of the semiconductor layers of the first group of memory cells are each equal to a first diameter and the diameters of the semiconductor layers of the second group of memory cells are each equal to a second diameter that is different from the first diameter.

11. The device according to claim 10, wherein the control circuit is configured to change a read voltage to be applied to the first group of memory cells during the first read operation by a first amount and change a read voltage to be applied to the second group of memory cells during the second read operation by a second amount that is different from the first amount.

12. The device according to claim 11, wherein the first diameter is larger than the second diameter and the first amount is smaller than the second amount.

13. A method of controlling a nonvolatile semiconductor memory device having a memory cell array that includes a plurality of memory cells, the method comprising:
performing a pre-read operation to read pre-selected memory cells before a read operation on target memory cells;
changing a read voltage that is to be applied to the target memory cells during the read operation based on a result of the pre-read operation; and
performing the read operation on the target memory cells;
wherein the pre-selected memory cells include none or less than all of the target memory cells.

14. The method according to claim 13,
wherein the pre-selected memory cells include some of the target memory cells.

15. The method according to claim 13,
wherein the memory cell array includes dummy memory cells that are different from the target memory cells, and
the dummy memory cells are set as the pre-selected memory cells to be read in the pre-read operation.

16. The method according to claim 13, further comprising:
correcting the read voltage that is to be applied to the target memory cells during the read operation based on a total number of write or erase operations performed on the memory cell array.

17. The method according to claim 13, wherein the nonvolatile semiconductor memory device has word lines stacked on a substrate, each of the word lines connected to a different group of memory cells, the method further comprising:
correcting the read voltage that is to be applied to the target memory cells during the read operation according to a distance from the substrate of the word line that is connected to the target memory cells.

18. The method according to claim 13, wherein the memory cells each have a semiconductor layer, the method further comprising:
correcting the read voltage that is to be applied to the target memory cells during the read operation according to diameters of the semiconductor layers of the target memory cells.

19. The method according to claim 13,
wherein the number of fail bits is counted during the pre-read operation, and
a read voltage to be applied to the memory cells during the read operation is changed according to the number of fail bits.

20. The method according to claim 13,
wherein during the pre-read operation, the read voltage is gradually changed, and
the read voltage to be applied to the memory cells during the read operation is changed according to a rate of increase in the number of memory cells having a threshold voltage lower than the read voltage, as the read voltage is gradually changed.

* * * * *